(12) United States Patent
Kondo et al.

(10) Patent No.: US 11,984,924 B2
(45) Date of Patent: May 14, 2024

(54) TRANSMIT/RECEIVE MODULE

(71) Applicant: Murata Manufacturing Co., Ltd., Kyoto (JP)

(72) Inventors: Seima Kondo, Kyoto (JP); Satoshi Tanaka, Kyoto (JP); Satoshi Arayashiki, Kyoto (JP); Hiroyuki Furusato, Kyoto (JP); Jin Yokoyama, Kyoto (JP); Toru Yamaji, Kyoto (JP); Akio Kaneda, Kyoto (JP); Kiwamu Sakano, Kyoto (JP); Junichi Yoshioka, Kyoto (JP); Tatsuya Tsujiguchi, Kyoto (JP); Atushi Ono, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 415 days.

(21) Appl. No.: 16/711,898

(22) Filed: Dec. 12, 2019

(65) Prior Publication Data
US 2020/0195295 A1 Jun. 18, 2020

(30) Foreign Application Priority Data

Dec. 14, 2018 (JP) .................................. 2018-234296

(51) Int. Cl.
*H04B 1/48* (2006.01)
*H03F 3/21* (2006.01)
*H05K 1/02* (2006.01)

(52) U.S. Cl.
CPC .................. *H04B 1/48* (2013.01); *H03F 3/21* (2013.01); *H05K 1/0243* (2013.01); *H03F 2200/294* (2013.01); *H03F 2200/451* (2013.01); *H05K 2201/10098* (2013.01)

(58) Field of Classification Search
CPC ...... H03F 2200/451; H03F 3/245; H03F 3/19; H03F 2200/294; H03F 2200/111; H03F 3/195; H03F 1/565; H03F 3/24; H03F 2203/21157; H03F 3/602; H03F 3/68; H03F 1/3241; H03F 3/21; H03F 2200/222; H03F 3/191; H03F 1/56; H03F 2200/318; H03F 3/211; H03F 3/72
USPC ........................................................ 370/278
See application file for complete search history.

(56) References Cited

U.S. PATENT DOCUMENTS

| | | | |
|---|---|---|---|
| 6,724,278 B1* | 4/2004 | Smith ...................... | H04B 1/52 333/133 |
| 2014/0225680 A1 | 8/2014 | Fujiwara et al. | |
| 2015/0028963 A1* | 1/2015 | Ebihara .................. | H03H 7/465 333/126 |
| 2017/0099608 A1* | 4/2017 | Lam ........................ | H04B 1/16 |

(Continued)

FOREIGN PATENT DOCUMENTS

| | | |
|---|---|---|
| CN | 103765774 A | 4/2014 |
| JP | 2018-101943 A | 6/2018 |

*Primary Examiner* — Ajibola A Akinyemi
(74) *Attorney, Agent, or Firm* — Pearne & Gordon LLP

(57) ABSTRACT

A transmit/receive module includes plural duplexers, a power amplifier, and a sending transmission line. The plural duplexers operate in bands different from each other and each includes a transmit filter and a receive filter. The power amplifier amplifies signals of pass bands of the plural transmit filters and outputs the amplified signals. The sending transmission line is connected to the plural transmit filters. The signals of the pass bands of the plural transmit filters output from the power amplifier are transmitted through the sending transmission line.

19 Claims, 27 Drawing Sheets

(56) References Cited

U.S. PATENT DOCUMENTS

2018/0175999 A1 6/2018 Yoshimi et al.
2020/0036401 A1* 1/2020 Ella .................... H04B 1/525

* cited by examiner

FIG. 7

| BAND NO. | UPLINK (MHz) | DOWNLINK (MHz) |
|---|---|---|
| 1 | 1920-1980 | 2110-2170 |
| 2 | 1850-1910 | 1930-1990 |
| 3 | 1710-1785 | 1805-1880 |
| 4 | 1710-1755 | 2110-2155 |
| 9 | 1749.9-1784.9 | 1844.9-1879.9 |
| 10 | 1710-1770 | 2110-2170 |
| 11 | 1427.9-1447.9 | 1475.9-1495.9 |
| 21 | 1447.9-1462.9 | 1495.9-1510.9 |
| 23 | 2000-2020 | 2180-2200 |
| 25 | 1850-1915 | 1930-1995 |
| 65 | 1920-2010 | 2110-2200 |
| 66 | 1710-1780 | 2110-2200 |
| 70 | 1695-1710 | 1995-2020 |
| 33 | 1900-1920 | - |
| 34 | 2010-2025 | - |
| 35 | 1850-1910 | - |
| 36 | 1930-1990 | - |
| 37 | 1910-1930 | - |
| 39 | 1880-1920 | - |

FIG. 8

| BAND NO. | UPLINK (MHz) | DOWNLINK (MHz) |
| --- | --- | --- |
| 5 | 824-849 | 869-894 |
| 6 | 830-840 | 875-885 |
| 8 | 880-915 | 925-960 |
| 12 | 699-716 | 729-746 |
| 13 | 777-787 | 746-756 |
| 14 | 788-798 | 758-768 |
| 17 | 704-716 | 734-746 |
| 18 | 815-830 | 860-875 |
| 19 | 830-845 | 875-890 |
| 20 | 832-862 | 791-821 |
| 26 | 814-849 | 859-894 |
| 27 | 807-824 | 852-869 |
| 28 | 703-748 | 758-803 |
| 29 | - | 717-728 |
| 67 | - | 738-758 |
| 68 | 698-728 | 753-783 |
| 71 | 663-698 | 617-652 |
| 85 | 698-716 | 728-746 |
| 44 | 703-803 | - |

FIG. 9

| DUPLEXER 31 | DUPLEXER 32 |
|---|---|
| 1 | 3 |
| 1 | 21 |
| 2 | 10 |
| 2 | 66 |
| 5 | 12 |
| 5 | 28 |
| 5 | 29 |
| 8 | 20 |
| 8 | 27 |
| 8 | 28 |
| 19 | 28 |
| 25 | 66 |

TRANSMIT/RECEIVE MODULE

This application claims priority from Japanese Patent Application No. 2018-234296 filed on Dec. 14, 2018. The content of this application is incorporated herein by reference in its entirety.

BACKGROUND

The present disclosure relates to a transmit/receive module. There is an increasing demand for multiband- and multimode-support mobile terminals in which a single mobile terminal is capable of handling multiple communication systems (multimode) and multiple frequency bands (multiband). The association between the frequency band and the communication system is defined by the communication standards. A sending signal amplified by a power amplifier is supplied to an antenna via a duplexer, and a received signal received by the antenna is supplied to a low-noise amplifier via a duplexer. The duplexer is usually provided for each band.

The power amplifier has a function of amplifying signals of a wide frequency range of multiple bands. A switch element is provided between the power amplifier and duplexers to supply a sending signal in a certain band amplified by the power amplifier to a duplexer corresponding to this band (see Japanese Unexamined Patent Application Publication No. 2018-101943, for example).

BRIEF SUMMARY

As the single power amplifier covers more bands, the switch element requires more contacts. This increases the insertion loss caused by the contacts of the switch element. Additionally, as the switch element uses more contacts, it is necessary to factor in the isolation characteristics between these contacts as design parameters. The insertion loss and the isolation characteristics have a tradeoff relationship. That is, it is difficult to regulate an increase in the insertion loss and also to maintain high isolation characteristics.

The present disclosure provides a transmit/receive module that is capable of regulating an increase in the insertion loss which would be caused by the use of a switch element.

According to an aspect of the present disclosure, there is provided a transmit/receive module including plural duplexers, a power amplifier, and a sending transmission line. The plural duplexers operate in bands different from each other and each include a transmit filter and a receive filter. The power amplifier amplifies signals of pass bands of the plural transmit filters and outputs the amplified signals. The sending transmission line is connected to the plural transmit filters. The signals of the pass bands of the plural transmit filters output from the power amplifier are transmitted through the sending transmission line.

The sending transmission line through which signals of the pass bands of the plural transmit filters are transmitted is connected to the plural transmit filters. It is thus possible to reduce the insertion loss which would be caused by a switch element, compared with the configuration in which a signal of the pass band of one of the plural transmit filters is selected and supplied to the associated transmit filter by using a switch element.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIGS. 7 and 8 are tables illustrating uplink and downlink frequency ranges of long term evolution (LTE) bands conforming to the communication standards defined by 3GPP;

FIG. 9 is a table illustrating examples of a combination of LTE bands that can be covered by the duplexers of the transmit/receive module of the first embodiment;

DETAILED DESCRIPTION

First Embodiment

A transmit/receive module 100 according to a first embodiment will be described below with reference to FIGS. 1A through 9. The transmit/receive module 100 is able to selectively send and receive signals in two frequency bands among multiple frequency bands defined by the communication standards.

Figure 1A:
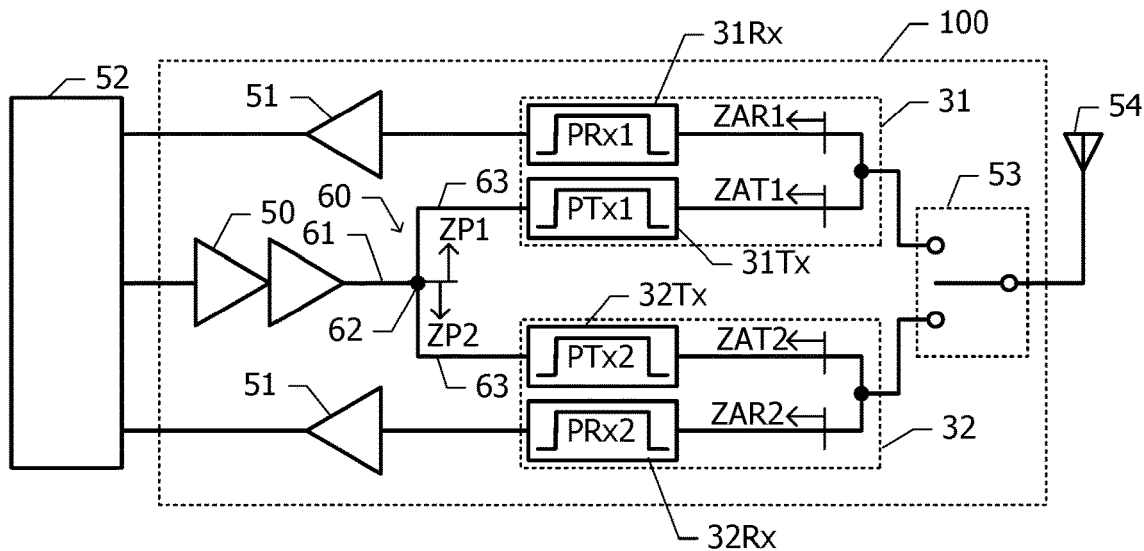
FIG. 1A is a block diagram of a transmit/receive module according to a first embodiment.

FIG. 1A is a block diagram of the transmit/receive module 100 according to the first embodiment. The transmit/receive module 100 includes two duplexers 31 and 32 which operate in bands different from each other, one power amplifier 50, two low-noise amplifiers 51 provided for the individual bands, and an antenna switch 53. These elements are mounted on a single substrate. The two triangles representing the power amplifier 50 in FIG. 1A show that the power amplifier 50 is a multi-stage amplifier, such as a two-stage amplifier.

The duplexer 31 includes a transmit filter 31Tx using a pass band PTx1 and a receive filter 31Rx using a pass band PRx1. The duplexer 32 includes a transmit filter 32Tx using a pass band PTx2 and a receive filter 32Rx using a pass band PRx2.

A sending radio-frequency (RF) signal is output from a transmit/receive circuit 52 and is input into the power amplifier 50. The output terminal of the power amplifier 50 is connected to the transmit terminals (input terminals) of the two transmit filters 31Tx and 32Tx via a sending transmission line 60. The sending transmission line 60 is constituted by a common portion 61 and two individual portions 63. The common portion 61 is provided for both the transmit filters 31Tx and 32Tx. The sending transmission line 60 branches off from the common portion 61 at a branching point 62 into the two individual portions 63 that are provided individually for the transmit filters 31Tx and 32Tx. One individual portion 63 connects the branching point 62 with the transmit terminal of the transmit filter 31Tx, while the other individual portion 63 connects the branching point 62 with the transmit terminal of the transmit filter 32Tx.

The power amplifier 50 cover the frequency ranges of the pass bands PTx1 and PTx2 of the two transmit filters 31Tx and 32Tx and amplifies signals of the pass bands PTx1 and PTx2. The sending transmission line 60 transmits signals of the pass bands PTx1 and PTx2 output from the power amplifier 50 to the transmit filters 31Tx and 32Tx, respectively.

A single-pole double-throw (SPDT) switch is used as the antenna switch 53. The antenna terminal of the duplexer 31 (the output terminal of the transmit filter 31Tx and the input terminal of the receive filter 31Rx) is connected to one contact of the antenna switch 53. The antenna terminal of the duplexer 32 (the output terminal of the transmit filter 32Tx and the input terminal of the receive filter 32Rx) is connected to the other contact of the antenna switch 53. The common terminal of the antenna switch 53 is connected to an antenna 54. The antenna switch 53 selectively connects one of the duplexers 31 and 32 with the antenna 54.

The receive terminals of the duplexers 31 and 32 (the output terminals of the receive filters 31Rx and 32Rx) are connected to the respective low-noise amplifiers 51. Received signals amplified by the low-noise amplifiers 51 are input into the transmit/receive circuit 52.

Figure 1B:
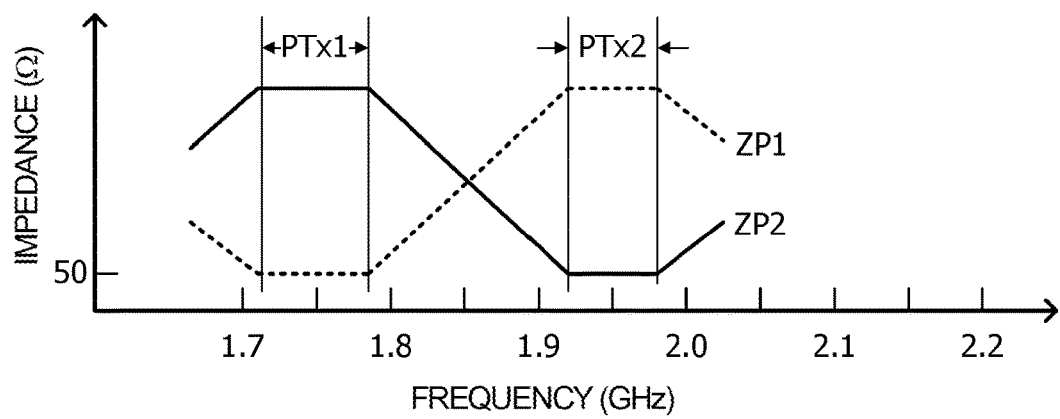
FIG. 1B is a graph illustrating the frequency characteristics of impedance ZP1 of one transmit filter and impedance ZP2 of the other transmit filter as seen from a branching point.

FIG. 1B is a graph illustrating the frequency characteristics of impedance ZP1 of the transmit filter 31Tx and impedance ZP2 of the transmit filter 32Tx as seen from the branching point 62. The horizontal axis indicates the frequency range by the unit GHz, and the vertical axis indicates the absolute value of impedance by the unit 2. The characteristic impedance of the sending transmission line 60 (hereinafter may simply be called the characteristic impedance) is 50Ω. That is, impedance matching is achieved when the impedance ZP1 and the impedance ZP2 are about 50Ω.

FIG. 1B illustrates the frequency characteristics of the impedance ZP1 when the duplexer 31 operates in the frequency range of LTE band 3 and those of the impedance ZP2 when the duplexer 32 operates in the frequency range of LTE band 1. LTE bands 3 and 1 are communication standards defined by Third Generation Partnership Project (3GPP). In LTE band 3, the uplink frequency range is 1710 to 1785 MHz, and the downlink frequency range is 1805 to 1880 MHz. In LTE band 1, the uplink frequency range is 1920 to 1980 MHz, and the downlink frequency range is 2110 to 2170 MHz.

The pass band PTx1 of the transmit filter 31Tx corresponds to the uplink frequency range of LTE band 3, while the pass band PRx1 of the receive filter 31Rx corresponds to the downlink frequency range of LTE band 3. The pass band PTx2 of the transmit filter 32Tx corresponds to the uplink frequency range of LTE band 1, while the pass band PRx2 of the receive filter 32Rx corresponds to the downlink frequency range of LTE band 1.

The impedance ZP1 with respect to the pass band PTx1 of the transmit filter 31Tx matches the characteristic impedance 50Ω, while the impedance ZP1 with respect to the pass band PTx2 of the other transmit filter 32Tx is high impedance. When the frequency of a sending signal output from the power amplifier 50 is within the pass band PTx1 of the transmit filter 31Tx, the transmit/receive module 100 is equivalent to a state in which the transmit filter 32Tx is not connected, and the sending signal is efficiently supplied to the transmit filter 31Tx. High impedance is defined such that its characteristic impedance is three times or more as high as the reference impedance (50Ω, for example).

Conversely, the impedance ZP2 with respect to the pass band PTx2 of the transmit filter 32Tx matches the characteristic impedance 50Ω, while the impedance ZP2 with respect to the pass band PTx1 of the other transmit filter 31Tx is high impedance. When the frequency of a sending signal output from the power amplifier 50 is within the pass band PTx2 of the transmit filter 32Tx, the transmit/receive module 100 is equivalent to a state in which the transmit filter 31Tx is not connected, and the sending signal is efficiently supplied to the transmit filter 32Tx.

In order to implement the impedance characteristics shown in FIG. 1B, a reactance element may be shunt-connected or series-connected to the sending transmission line 60 (FIG. 1A). In FIG. 1A, an impedance matching circuit and a reactance element connected to the sending transmission line 60 are not shown.

Figure 1C:
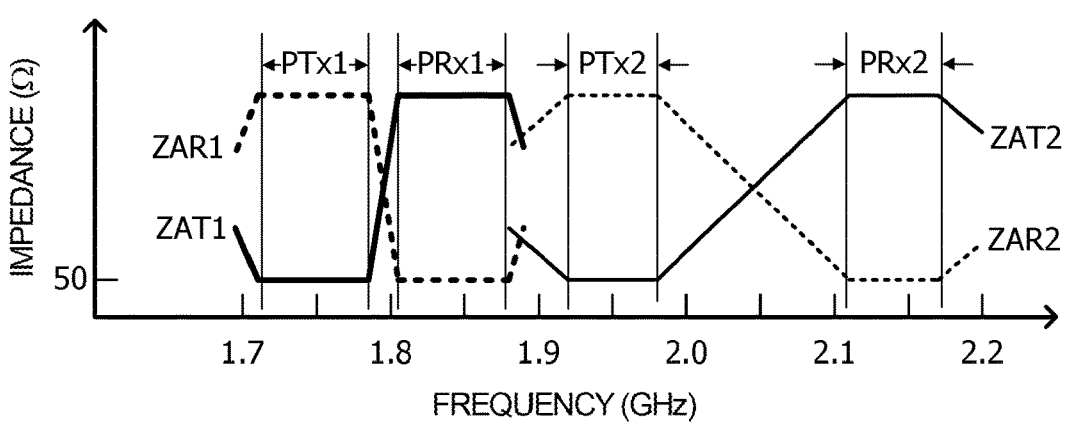
FIG. 1C is a graph illustrating the frequency characteristics of impedance ZAT1 of one transmit filter and impedance ZAR1 of one receive filter as seen from an antenna terminal and those of impedance ZAT2 of the other transmit filter and impedance ZAR2 of the other receive filter as seen from the antenna terminal.

FIG. 1C is a graph illustrating the frequency characteristics of impedance ZAT1 of the transmit filter 31Tx and impedance ZAR1 of the receive filter 31Rx as seen from the antenna terminal of the duplexer 31. FIG. 1C also illustrates the frequency characteristics of impedance ZAT2 of the transmit filter 32Tx and impedance ZAR2 of the receive filter 32Rx as seen from the antenna terminal of the duplexer 32.

The impedance ZAR1 with respect to the pass band PRx1 of the receive filter 31Rx matches the characteristic impedance 50Ω, while the impedance ZAR1 with respect to the pass band PTx1 of the transmit filter 31Tx is high impedance. For a received signal of a frequency within the pass band PRx1 of the receive filter 31Rx supplied from the antenna 54 to the duplexer 31, the transmission line from the antenna 54 to the receive filter 31Rx is equivalent to a state in which the transmit filter 31Tx is not connected. The received signal is thus efficiently supplied to the receive filter 31Rx.

The impedance ZAR1 is high impedance with respect to the pass band PTx1 of the transmit filter 31Tx. For a sending signal to pass through the transmit filter 31Tx and to be supplied to the antenna 54, the transmission line from the transmit filter 31Tx to the antenna 54 is equivalent to a state in which the receive filter 31Rx is not connected. The impedance ZAT1 as seen from the antenna terminal of the duplexer 31 to the transmit filter 31Tx matches the characteristic impedance 50Ω of the transmission line through which the sending signal is supplied to the antenna 54.

Concerning the duplexer 32, the relationships among the impedance ZAT2 and the impedance ZAR2 and the pass band PTx2 of the transmit filter 32Tx and the pass and PRx2 of the receive filter 32Rx are similar to those of the duplexer 31.

Advantages of the first embodiment shown in FIGS. 1A through 1C will be discussed below.

In the first embodiment, the output terminal of the power amplifier 50 and the two transmit filters 31Tx and 32Tx are connected to each other by the sending transmission line 60 without necessarily a switch interposed therebetween. As a result, the insertion loss caused by a switch does not occur.

When a sending signal of a frequency within the pass band PTx1 of the transmit filter 31Tx is transmitted through the sending transmission line 60, the impedance ZP2 of the transmit filter 32Tx as seen from the branching point 62 is high impedance. The sending signal can thus be supplied to the transmit filter 31Tx with a small insertion loss. Likewise, a sending signal of a frequency within the pass band PTx2 of the transmit filter 32Tx can be supplied to the transmit filter 32Tx with a small insertion loss.

The desirable magnitude of high impedance of the impedance ZP1 and the impedance ZP2 will be explained below with reference to FIGS. 2A and 2B.

Figure 2A:
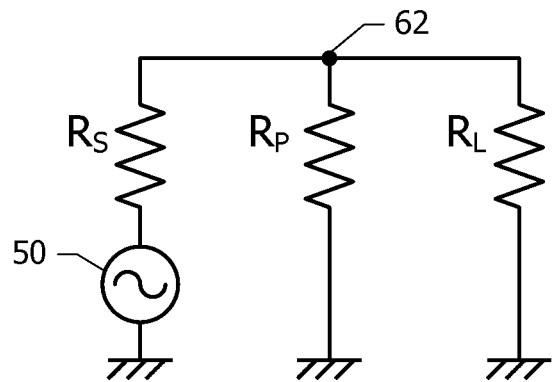
FIG. 2A is an equivalent circuit diagram of a power amplifier and two transmit filters.

FIG. 2A is an equivalent circuit diagram of the power amplifier 50 and the two transmit filters 31Tx and 32Tx. The output impedance of the power amplifier 50 is represented by $R_S$. The impedance of the transmit filter that matches the characteristic impedance 50Ω as seen from the branching point 62 is represented by $R_L$, while the impedance of the transmit filter which is high impedance as seen from the branching point 62 is represented by $R_P$. The output impedance $R_S$ and the impedance $R_L$ are set to be 50Ω, and the impedance $R_P$ is varied. Then, the insertion loss is calculated.

Figure 2B:
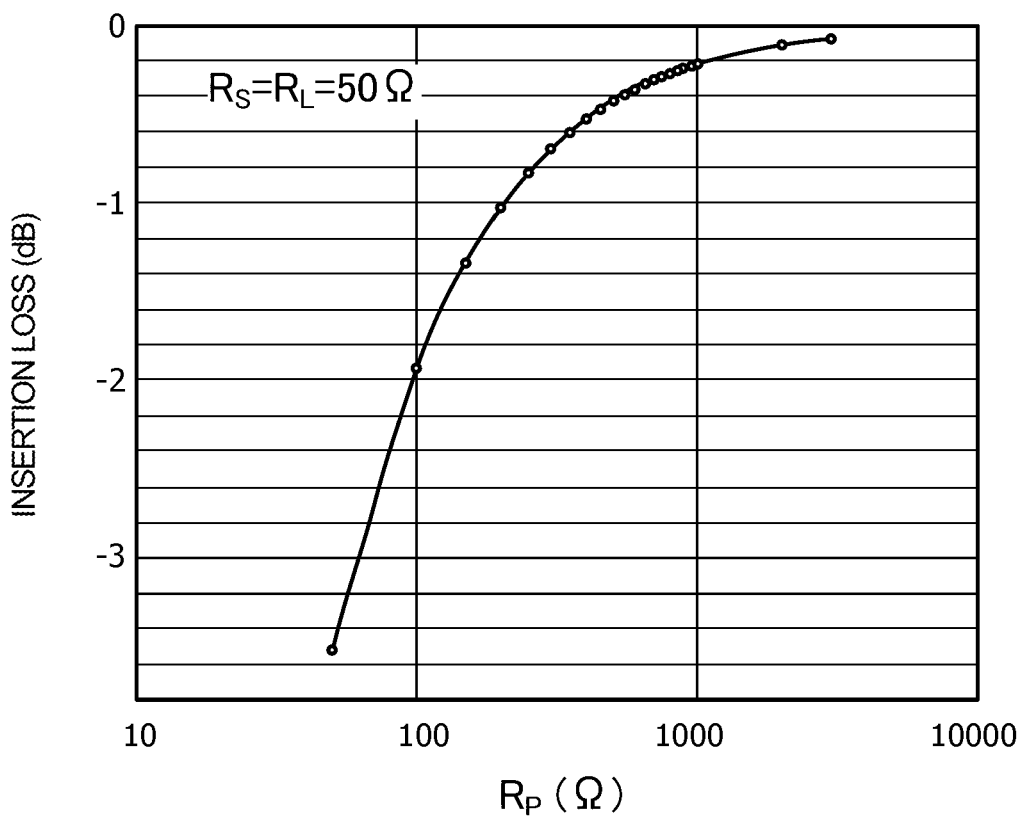
FIG. 2B is a graph illustrating the insertion loss of a signal sent from the power amplifier to a transmit filter.

FIG. 2B is a graph illustrating the insertion loss of a signal sent from the power amplifier 50 to a transmit filter. The horizontal axis indicates the impedance $R_P$ by the unit Ω, and the vertical axis indicates the insertion loss by the unit dB.

The graph shows that as the impedance $R_P$ becomes higher, the insertion loss becomes smaller. In terms of the loss caused by a switch element inserted between a power amplifier and plural transmit filters, the insertion loss can be −0.4 dB or greater, and can be, −0.25 dB or greater. When the impedance $R_P$ is about 500Ω or higher, the insertion loss is −0.4 dB or greater. When the impedance $R_P$ is about 800Ω or higher, the insertion loss is −0.25 dB or greater.

When the impedance ZP1 and the impedance ZP2 in FIG. 1A are ten times or more as high as the characteristic impedance of the sending transmission line 60, they can be high impedance. When the impedance ZP1 and the impedance ZP2 in FIG. 1A are sixteen times or more as high as the characteristic impedance of the sending transmission line 60, they can be high impedance.

An explanation will be given, with reference to FIGS. 3A through 5F, of an example of the configuration that achieves the frequency characteristics of the impedance ZP1 and the impedance ZP2 shown in FIG. 1B.

Figure 3A:
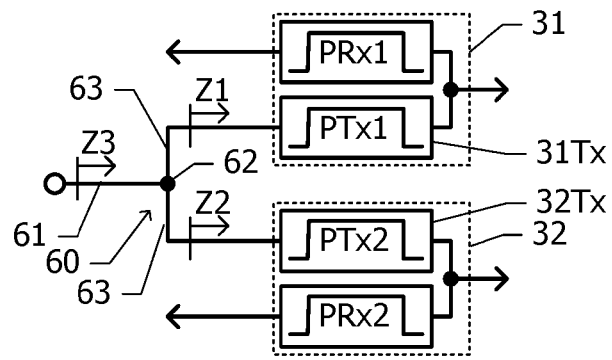
FIG. 3A is a block diagram illustrating the connection state of two duplexers of a transmit/receive module according to a comparative example.

FIG. 3A is a block diagram illustrating the connection state of two duplexers 31 and 32 of a transmit/receive module according to a comparative example. A sending signal output from the power amplifier 50 (FIG. 1A) is transmitted through a sending transmission line 60. The sending transmission line 60 branches off from a common portion 61 at a branching point 62 into two individual portions 63 that are connected to the transmit terminals of transmit filters 31Tx and 32Tx.

Figure 3B:
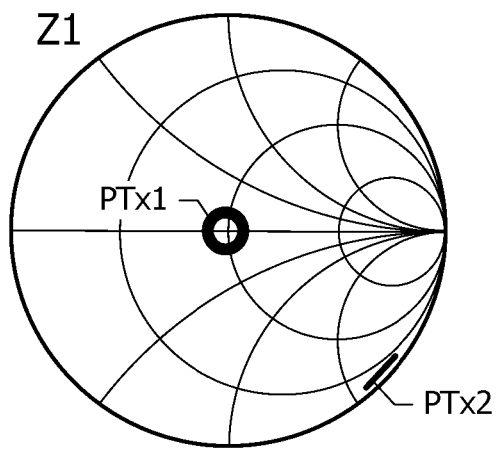
FIGS. 3B, 3C, and 3D are graphs on Smith charts illustrating input impedance Z1, Z2, and Z3, respectively.
Figure 3C:
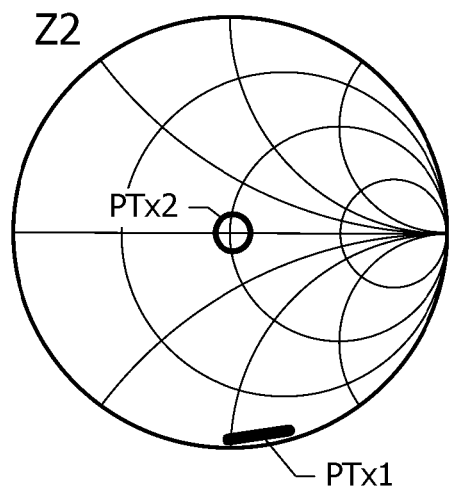

FIG. 3B is a graph on a Smith chart illustrating input impedance Z1 of the transmit filter 31Tx. FIG. 3C is a graph on a Smith chart illustrating input impedance Z2 of the transmit filter 32Tx. In FIGS. 3B and 3C, a circle on the Smith chart represents that points of impedance in a certain frequency band are localized within this circle. The other Smith charts including that shown in FIG. 3D are also illustrated in a similar manner.

In the comparative example, the transmit filters 31Tx and 32Tx exhibit desirable impedance characteristics when they are individually connected to the power amplifier 50. This will be explained more specifically. As shown in FIG. 3B, the input impedance Z1 of the transmit filter 31Tx with respect to the pass band PTx1 of the transmit filter 31Tx matches the characteristic impedance of the sending transmission line 60. As shown in FIG. 3C, the input impedance Z2 of the transmit filter 32Tx with respect to the pass band PTx2 of the transmit filter 32Tx matches the characteristic impedance of the sending transmission line 60. The input impedance Z1 of the transmit filter 31Tx with respect to the pass band PTx2 does not match the characteristic impedance of the sending transmission line 60 but becomes capacitive. Likewise, the input impedance Z2 of the transmit filter 32Tx with respect to the pass band PTx1 does not match the characteristic impedance of the sending transmission line 60 but becomes capacitive.

Figure 3D:
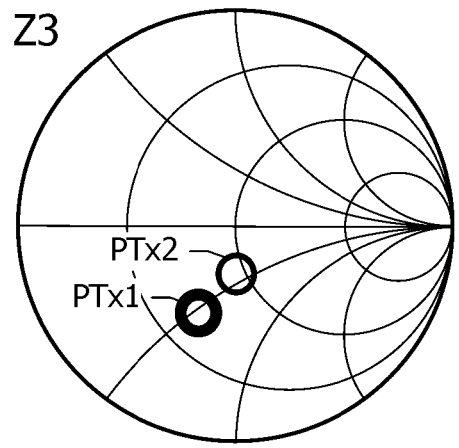

FIG. 3D is a graph on a Smith chart illustrating impedance Z3 of the transmit filters 31Tx and 32Tx as seen from the common portion 61 of the sending transmission line 60. From the viewpoint of the transmit filter 31Tx, with respect to the pass band PTx1, the capacitive input impedance Z2 of the transmit filter 32Tx (FIG. 3C) is connected in parallel with the impedance Z1, and the impedance Z3 in the pass band PTx1 is located in the third quadrant (¼ bottom left portion) of the Smith chart. Likewise, the impedance Z3 in the pass band PTx2 is also located in the third quadrant of the Smith chart. Additionally, the impedance Z3 in the pass band PTx1 and that in the pass band PTx2 are separated from each other. From this state, it is difficult to make the impedance Z3 match the characteristic impedance both with respect to the pass bands PTx1 and PTx2.

Figure 4A:
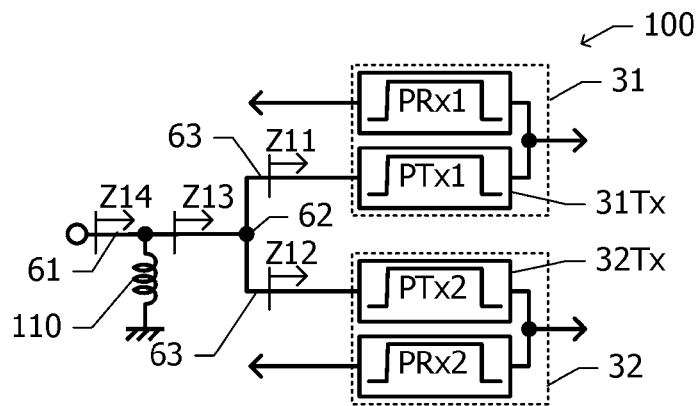
FIG. 4A is a block diagram illustrating the connection state of two duplexers of the transmit/receive module according to the first embodiment.

FIG. 4A is a block diagram illustrating the connection state of the two duplexers 31 and 32 of the transmit/receive module 100 according to the first embodiment. In the first embodiment, a shunt inductor 110 is connected to the common portion 61 of the sending transmission line 60, that is, a portion where a sending signal to be input into the transmit filter 31Tx and that into the transmit filter 32Tx are both transmitted.

Figure 4B:
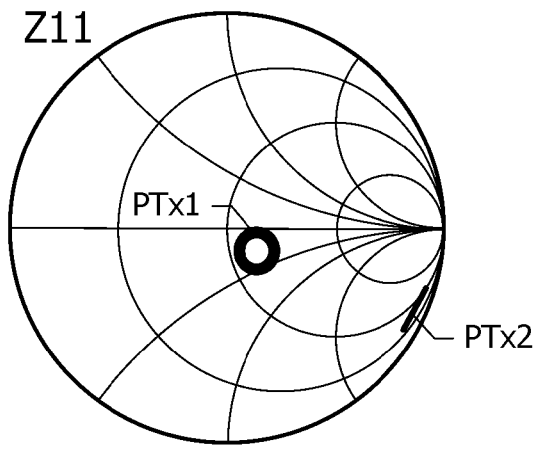
FIGS. 4B through 4E are graphs on Smith charts illustrating input impedance Z11, Z12, Z13, and Z14, respectively.
Figure 4C:
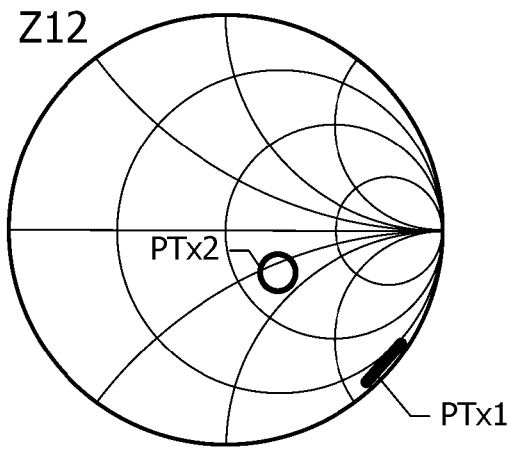

FIG. 4B is a graph on a Smith chart illustrating input impedance Z11 of the transmit filter 31Tx. FIG. 4C is a graph on a Smith chart illustrating input impedance Z12 of the transmit filter 32Tx. The input impedance Z11 of the transmit filter 31Tx (FIG. 4B) with respect to the pass band PTx1 is higher than the characteristic impedance and is rather capacitive. Likewise, the input impedance Z12 of the transmit filter 32Tx (FIG. 4C) with respect to the pass band PTx2 is higher than the characteristic impedance and is rather capacitive. That is, the input impedance Z11 of the transmit filter 31Tx with respect to the pass band PTx1 and the input impedance Z12 of the transmit filter 32Tx with respect to the pass band PTx2 are located in the fourth quadrants (¼ bottom right portion) of the Smith charts.

The input impedance Z11 with respect to the pass band PTx2 of the transmit filter 32Tx is capacitive, while the input impedance Z12 with respect to the pass band PTx1 of the transmit filter 31Tx is capacitive. The capacitance component of the input impedance Z11 in the pass band PTx2 is larger than that in the pass band PTx1. Similarly, the capacitance component of the input impedance Z12 in the pass band PTx1 is larger than that in the pass band PTx2. The resistance component of the input impedance Z11 in the pass band PTx2 is smaller than that in the pass band PTx1, and the resistance component of the input impedance Z12 in the pass band PTx1 is smaller than that in the pass band PTx2. For example, the input impedance Z11 with respect to the pass band PTx2 of the transmit filter 32Tx and the input impedance Z12 with respect to the pass band PTx1 of the transmit filter 31Tx are located in the fourth quadrants of the Smith charts.

Figure 4D:
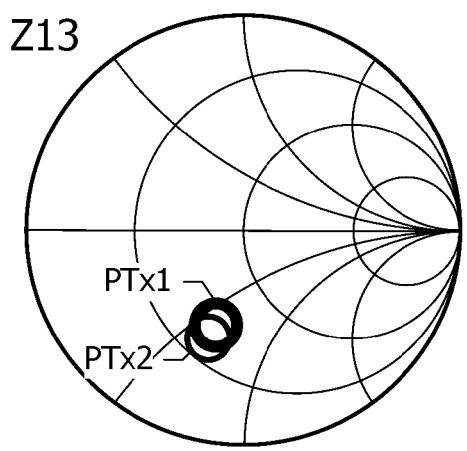

FIG. 4D is a graph on a Smith chart illustrating impedance Z13 of the transmit filters 31Tx and 32Tx as seen from the common portion 61 of the sending transmission line 60 without necessarily the shunt inductor 110. From the viewpoint of the transmit filter 31Tx, with respect to the pass band PTx1, the capacitive input impedance Z12 of the transmit filter 32Tx (FIG. 4C) is connected in parallel with the impedance Z11, and the impedance Z13 (FIG. 4D) in the pass band PTx1 is located in the third quadrant (¼ bottom left portion) of the Smith chart. Likewise, the impedance Z13 in the pass band PTx2 (FIG. 4D) is also located in the third quadrant of the Smith chart.

In this case, the capacitance component of the impedance Z11 in the pass band PTx2 (FIG. 4B) and that of the impedance Z12 in the pass band PTx1 (FIG. 4C) are set so that the impedance Z13 in the pass band PTx1 (FIG. 4D) and that in the pass band PTx2 (FIG. 4D) approach each other.

Figure 4E:
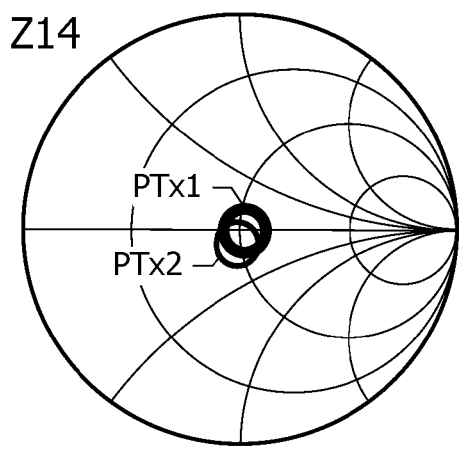

FIG. 4E is a graph on a Smith chart illustrating impedance Z14 of the transmit filters 31Tx and 32Tx as seen from the signal input terminal of the sending transmission line 60 with the shunt inductor 110. As a result of connecting the impedance of the shunt inductor 110 to the impedance Z13 (FIG. 4D), the impedance Z14 approaches closer to the center of the Smith chart than the impedance Z13 does. The inductance of the shunt inductor 110 is determined so that the impedance Z14 approaches the vicinity of the center of the Smith chart. The impedance of the shunt inductor 110 in the pass band PTx1 of the transmit filter 31Tx is different from that in the pass band PTx2 of the transmit filter 32Tx. As a result of deliberately setting different initial values for the input impedance Z11 of the transmit filter 31Tx and for the input impedance Z12 of the transmit filter 32Tx, the impedance Z14 can be adjusted to 50Ω both with respect to the pass bands PTx1 and PTx2 by using the single shunt inductor 110.

In the first embodiment, in the state in which the transmit terminals of the transmit filters 31Tx and 32Tx are connected to each other, the impedance Z13 in the pass band PTx1 and that in the pass band PTx2 are caused to approach each other in the third quadrant of the Smith chart. As a result, the impedance Z14 can be adjusted to the characteristic impedance (impedance matching) both in the pass bands PTx1 and PTx2 by using the shunt inductor 110.

Figure 5A:
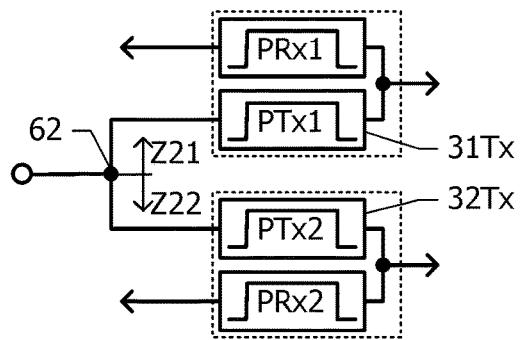
FIG. 5A is a block diagram of the transmit/receive module of the first embodiment without necessarily a shunt inductor.
Figure 5B:
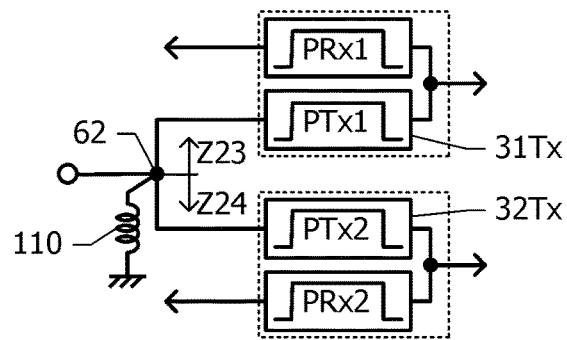
FIG. 5B is a block diagram of the transmit/receive module of the first embodiment with a shunt inductor.

FIG. 5A is a block diagram of the transmit/receive module 100 of the first embodiment without necessarily the shunt inductor 110. FIG. 5B is a block diagram of the transmit/receive module 100 of the first embodiment with the shunt inductor 110. Although the shunt inductor 110 is connected to the branching point 62 in FIG. 5B, the configuration shown in FIG. 5B is equivalent to that in FIG. 4A in terms of the operation.

Figure 5C:
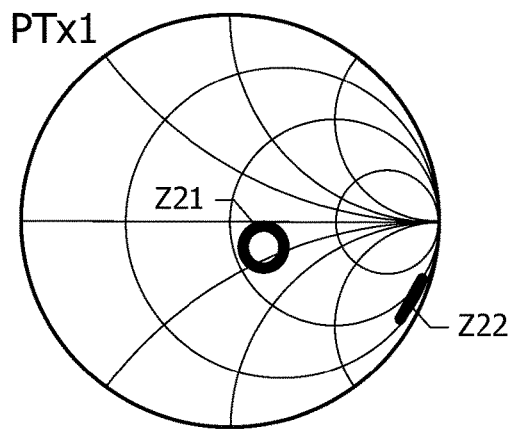
FIG. 5C is a graph on a Smith chart illustrating impedance Z21 and Z22 in terms of pass band PTx1 of one transmit filter.
Figure 5D:
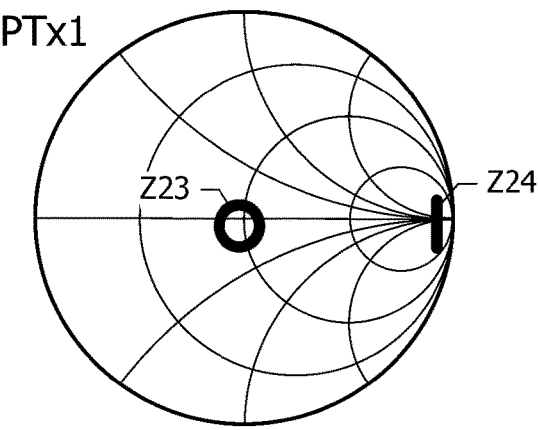
FIG. 5D is a graph on a Smith chart illustrating impedance Z23 and Z24 in terms of pass band PTx1.

FIGS. 5C and 5D are graphs on Smith charts illustrating impedance only in terms of the pass band PTx1 of the transmit filter 31Tx. FIG. 5C is a graph on a Smith chart illustrating impedance Z21 of the transmit filter 31Tx and impedance Z22 of the transmit filter 32Tx as seen from the branching point 62 without necessarily the shunt inductor 110 (FIG. 5A). FIG. 5D is a graph on a Smith chart illustrating impedance Z23 of the transmit filter 31Tx and impedance Z24 of the transmit filter 32Tx as seen from the branching point 62 with the shunt inductor 110 (FIG. 5B).

The impedance Z23 of the transmit filter 31Tx (FIG. 5D) with the shunt inductor 110 approaches closer to the center of the Smith chart than the impedance Z21 of the transmit filter 31Tx (FIG. 5C) without necessarily the shunt inductor 110. The impedance Z24 of the transmit filter 32Tx (FIG. 5D) with the shunt inductor 110 approaches closer to the impedance infinite point of the Smith chart than the impedance Z22 of the transmit filter 32Tx (FIG. 5C) without necessarily the shunt inductor 110.

Figure 5E:
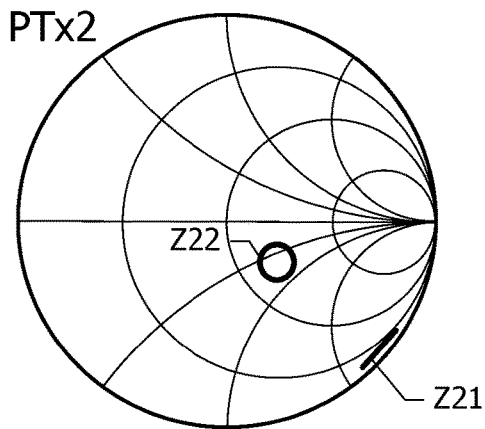
FIG. 5E is a graph on a Smith chart illustrating impedance Z21 and Z22 in terms of pass band PTx2 of the other transmit filter.
Figure 5F:
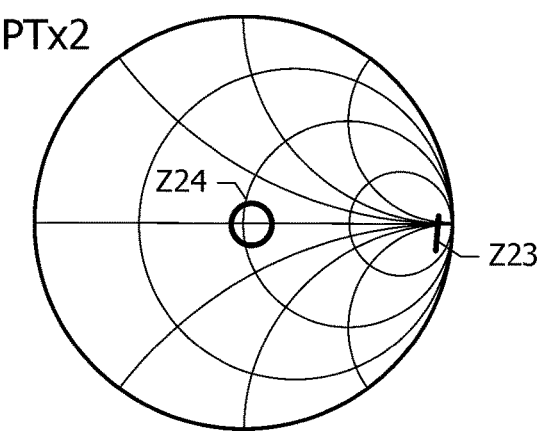
FIG. 5F is a graph on a Smith chart illustrating impedance Z23 and Z24 in terms of pass band PTx2.

FIGS. 5E and 5F are graphs on Smith charts illustrating impedance only in terms of the pass band PTx2 of the transmit filter 32Tx. As in the pass band PTx1 (FIGS. 5C and 5D), the impedance Z24 of the transmit filter 32Tx (FIG. 5F) with the shunt inductor 110 is positioned near the center of the Smith chart, and the impedance Z23 of the transmit filter 31Tx (FIG. 5F) with the shunt inductor 110 is positioned near the impedance infinite point of the Smith chart.

As described above, in the first embodiment, the impedance of the transmit filter 31Tx as seen from the branching point 62 with respect to the pass band PTx1 matches the characteristic impedance, while the impedance of the transmit filter 31Tx with respect to the pass band PTx2 is high impedance. Likewise, the impedance of the transmit filter 32Tx as seen from the branching point 62 with respect to the pass band PTx2 matches the characteristic impedance, while the impedance of the transmit filter 32Tx with respect to the pass band PTx1 is high impedance. These characteristics correspond to the impedance characteristics shown in FIG. 1B.

A description will now be given of the desirable conditions for making the impedance Z23 with respect to the pass band PTx1 match the characteristic impedance and the impedance Z23 with respect to the pass band PTx2 become high impedance and for making the impedance Z24 with respect to the pass band PTx2 match the characteristic impedance and the impedance 24 with respect to the pass band PTx1 become high impedance.

The input impedance Z11 of the transmit filter 31Tx with respect to the pass band PTx1 and the input impedance Z12 of the transmit filter 32Tx with respect to the pass band PTx2 can be set to be higher than the characteristic impedance 50Ω, as shown in FIGS. 4B and 4C. However, if the input impedance Z11 and the input impedance Z12 are much higher than 50Ω, it is difficult to implement impedance matching. The input impedance Z11 and the input impedance Z12 can be set to 60Ω at the highest. Typically, the input impedance Z11 with respect to the pass band PTx1 and the input impedance Z12 with respect to the pass band PTx2 can be set to be higher than the characteristic impedance and the highest input impedance Z11 and Z12 is set to be 1.2 times as high as the characteristic impedance.

Examples of an impedance matching circuit disposed between the power amplifier 50 and the transmit filters 31Tx and 32Tx of the transmit/receive module 100 of the first embodiment will be discussed below with reference to FIGS. 6A and 6B.

Figure 6A:
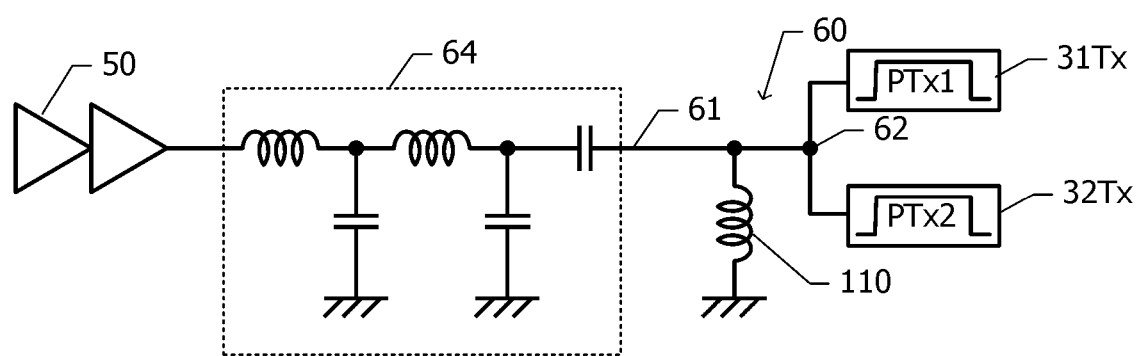
FIGS. 6A and 6B are equivalent circuit diagrams of impedance matching circuits disposed between the power amplifier and the transmit filters of the transmit/receive module of the first embodiment.
Figure 6B:
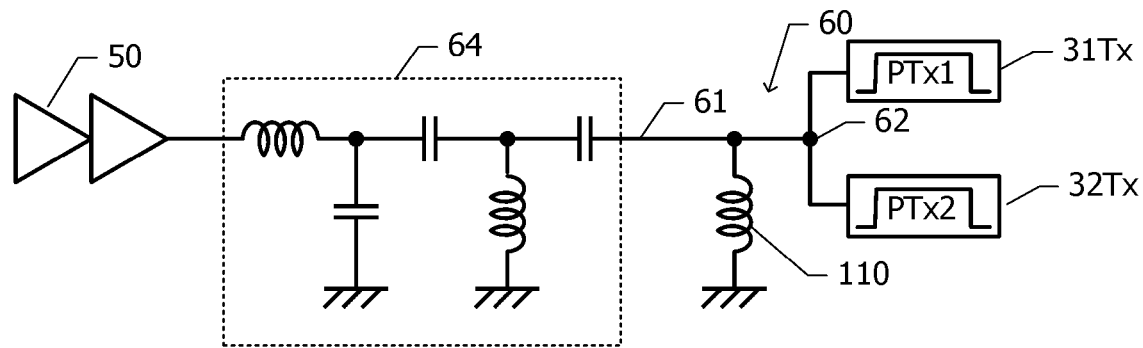

FIGS. 6A and 6B are equivalent circuit diagrams of impedance matching circuits 64 disposed between the power amplifier 50 and the transmit filters 31Tx and 32Tx of the transmit/receive module 100 (FIG. 1A) of the first embodiment. Each of the impedance matching circuits 64 shown in FIGS. 6A and 6B is disposed in the common portion 61 of the sending transmission line 60 between the power amplifier 50 and the branching point 62. The impedance matching circuit 64 shown in FIG. 6A is constituted by two series inductors, two shunt capacitors, and one series capacitor. The impedance matching circuit 64 shown in FIG. 6B is constituted by one series inductor, two series capacitors, one shunt capacitor, and one shunt inductor. In FIGS. 6A and 6B, the shunt inductor 110 (FIG. 4A) is connected to the common portion 61 of the sending transmission line 60 between the impedance matching circuit 64 and the branching point 62.

As shown in FIGS. 6A and 6B, as a result of connecting the shunt inductor 110 between the impedance matching circuit 64 and the branching point 62, the impedance of the power amplifier 50 and that of the transmit filters 31Tx and 32Tx as seen from the sending transmission line 60 between the impedance matching circuit 64 and the shunt inductor 110 can match each other. The topology of the impedance matching circuit 64 is not restricted to those shown in FIGS. 6A and 6B.

Examples of a combination of LTE bands that can be covered by the two duplexers 31 and 32 will be discussed below with reference to FIGS. 7, 8, and 9.

FIGS. 7 and 8 are tables illustrating uplink and downlink frequency ranges of LTE bands that conform to the communication standards defined by 3GPP. FIG. 7 shows LTE bands of 1500 to 2200 MHz. FIG. 8 shows LTE bands of 600 to 900 MHz. LTE bands having both the uplink and downlink frequency ranges are used for duplex mode of frequency-division multiplexing (FDM). LTE bands having only the uplink frequency range is used for duplex mode of time-division multiplexing (TDM). LTE bands having only the downlink frequency range is used for supplemental downlink.

The uplink frequency ranges of LTE bands 3, 4, 9, 10, and 66 shown in FIG. 7 overlap each other. The uplink frequency ranges of LTE bands 5 and 6 shown in FIG. 8 also overlap each other. The transmit/receive module 100 of the first embodiment is applicable only when the pass band PTx1 of one transmit filter 31Tx and the pass band PTx2 of the other transmit filter 32Tx do not overlap each other, as shown in FIG. 1B. It is not possible for the transmit/receive module 100 to cover two LTE bands having overlapping uplink frequency ranges.

FIG. 9 is a table illustrating examples of a combination of LTE bands that can be covered by the duplexers 31 and 32 (FIG. 1A) of the transmit/receive module 100 of the first embodiment. For example, one duplexer 31 covers LTE band 1, while the other duplexer 32 covers the LTE band 3. Combinations of LTE bands that can be covered by the transmit/receive module 100 are not limited to those shown in FIG. 9. The transmit/receive module 100 of the first embodiment can cover two LTE bands whose uplink frequency bands do not overlap each other. The transmit/receive module 100 may also be applicable to new bands that may be proposed in the future.

Second Embodiment

A transmit/receive module 100 according to a second embodiment will be described below with reference to FIGS. 10A through 11F. An explanation of the elements having the same configurations as those of the transmit/receive module 100 of the first embodiment will be omitted.

Figure 10A:
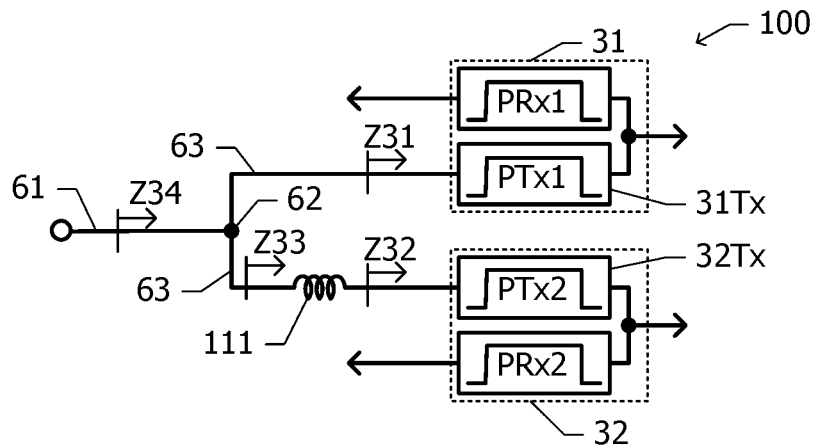
FIG. 10A is a block diagram illustrating the connection state of two duplexers of a transmit/receive module according to a second embodiment.

FIG. 10A is a block diagram illustrating the connection state of two duplexers 31 and 32 of the transmit/receive module 100 according to the second embodiment. In the first embodiment, the shunt inductor 110 is connected to the common portion 61 of the sending transmission line 60. In the second embodiment, a series inductor 111 is inserted in an individual portion 63 of a sending transmission line 60 connected to a transmit filter 32Tx. A transmit filter 31Tx is directly connected to the branching point 62.

Figure 10B:
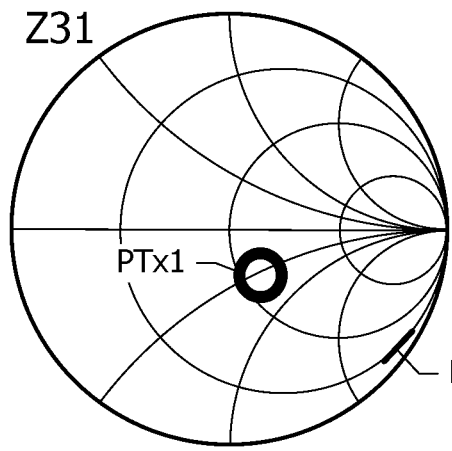
FIGS. 10B through 10E are graphs on Smith charts illustrating input impedance Z31, Z32, Z33, and Z34, respectively.
Figure 10C:
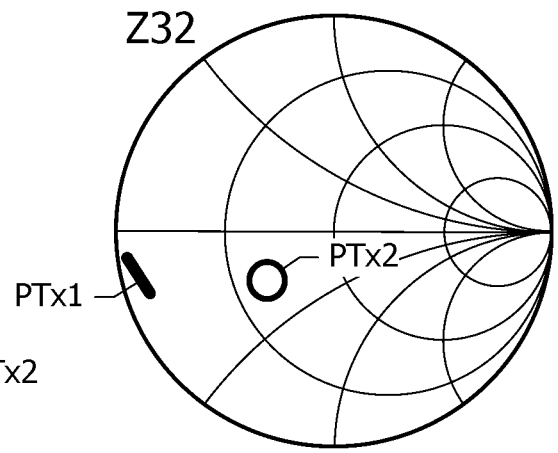

FIG. 10B is a graph on a Smith chart illustrating input impedance Z31 of the transmit filter 31Tx. FIG. 10C is a graph on a Smith chart illustrating input impedance Z32 of the transmit filter 32Tx. The input impedance Z31 of the transmit filter 31Tx (FIG. 10B) with respect to the pass band PTx1 is higher than the characteristic impedance and is rather capacitive. The input impedance Z31 with respect to the pass band PTx2 of the other transmit filter 32Tx has a smaller resistance component and a larger capacitance component than that in the pass band TPx1. The input impedance Z31 in the pass band PTx1 and that in the pass band PTx2 (FIG. 10B) are both located in the fourth quadrant of the Smith chart.

The input impedance Z32 of the transmit filter 32Tx (FIG. 10C) with respect to the pass band PTx2 is lower than the characteristic impedance and is rather capacitive. The input impedance Z32 with respect to the pass band PTx1 of the other transmit filter 31Tx has a smaller resistance component and a smaller capacitance component than that in the pass band TPx2. The input impedance Z32 in the pass band PTx2 and that in the pass band PTx1 (FIG. 10C) are both located in the third quadrant of the Smith chart.

Figure 10D:
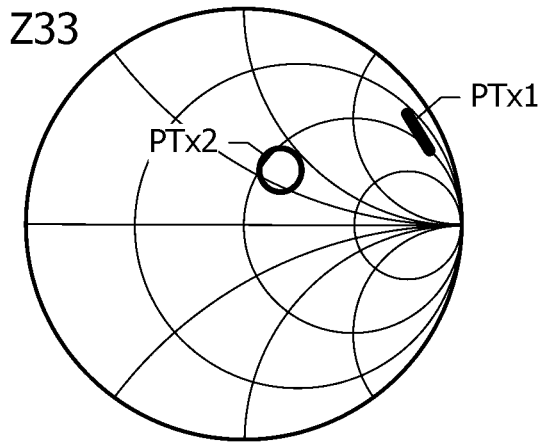

FIG. 10D is a graph on a Smith chart illustrating impedance Z33 of the transmit filter 32Tx as seen from the branching point 62 via the series inductor 111. The impedance Z33 of the transmit filter 32Tx connected to the series inductor 111 with respect to the pass band PTx2 is slightly higher than the characteristic impedance and is inductive. The impedance Z33 with respect to the pass band PTx1 is also inductive. The impedance Z33 in the pass band PTx1 and that in the pass band PTx2 are both located in the first quadrant (¼ top right portion) of the Smith chart.

Figure 10E:
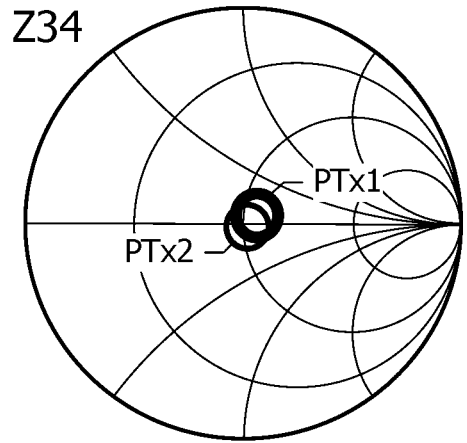

FIG. 10E is a graph on a Smith chart illustrating impedance Z34 of the transmit filters 31Tx and 32Tx as seen from the signal input terminal of the sending transmission line 60 having the series inductor 111 connected thereto. The impedance of the transmit filter 31Tx and that of the transmit filter 32Tx with respect to the pass band PTx1 are connected in parallel with each other. Likewise, the impedance of the transmit filter 32Tx and that of the transmit filter 31Tx with respect to the pass band PTx2 are connected in parallel with each other. Hence, the impedance Z34 is located in the vicinity of the center of the Smith chart both with respect to the pass bands PTx1 and PTx2.

In the second embodiment, the input impedance Z31 of the transmit filter 31Tx with respect to the pass band PTx1 is set to be slightly higher than the characteristic impedance, while the input impedance Z32 of the transmit filter 32Tx with respect to the pass band PTx2 is set to be slightly lower than the characteristic impedance. As a result, the impedance Z34 can be adjusted to the characteristic impedance (impedance matching) both with respect to the pass bands PTx1 and PTx2 by using the series inductor 111.

Figure 11A:
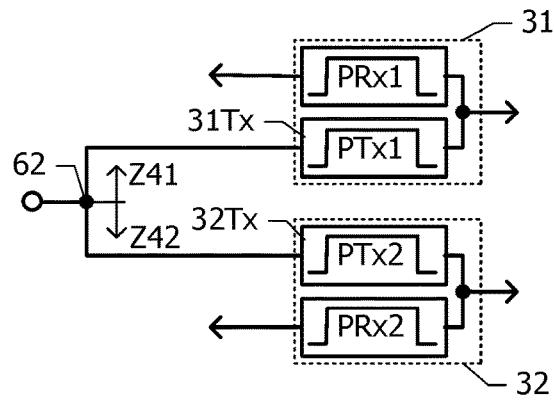
FIG. 11A is a block diagram of the transmit/receive module of the second embodiment without necessarily a series inductor.
Figure 11B:
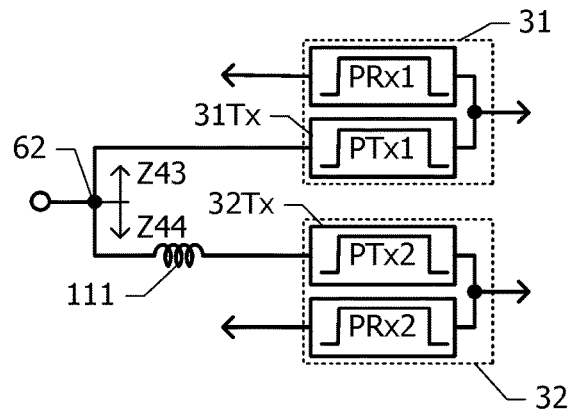
FIG. 11B is a block diagram of the transmit/receive module of the second embodiment with a series inductor.

FIG. 11A is a block diagram of the transmit/receive module 100 of the second embodiment without necessarily the series inductor 111. FIG. 11B is a block diagram of the transmit/receive module 100 of the second embodiment with the series inductor 111.

Figure 11C:
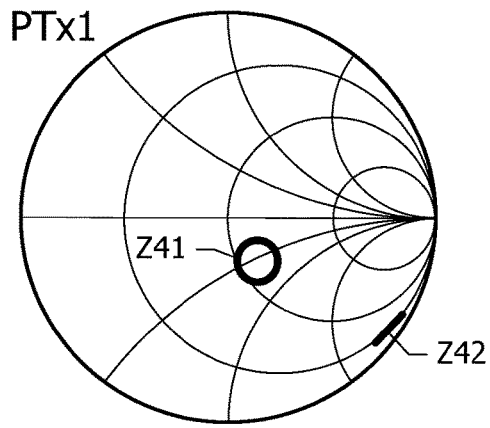
FIG. 11C is a graph on a Smith chart illustrating impedance Z41 and Z42 in terms of pass band PTx1 of one transmit filter.
Figure 11D:
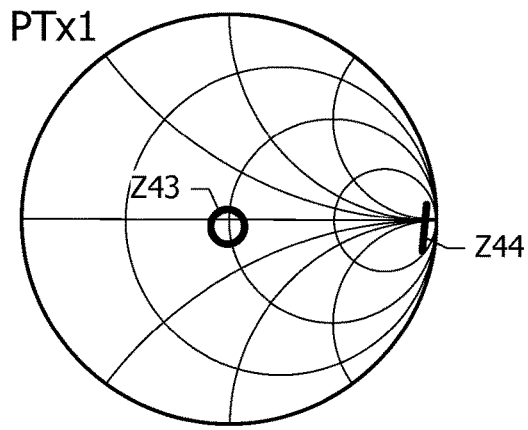
FIG. 11D is a graph on a Smith chart illustrating impedance Z43 and Z44 in terms of pass band PTx1.
Figure 11E:
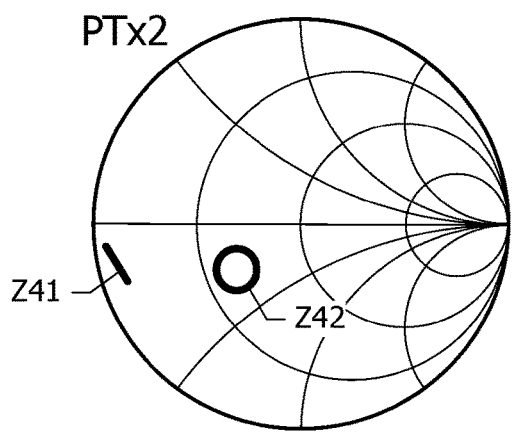
FIG. 11E is a graph on a Smith chart illustrating impedance Z41 and Z42 in terms of pass band PTx2 of the other transmit filter.
Figure 11F:
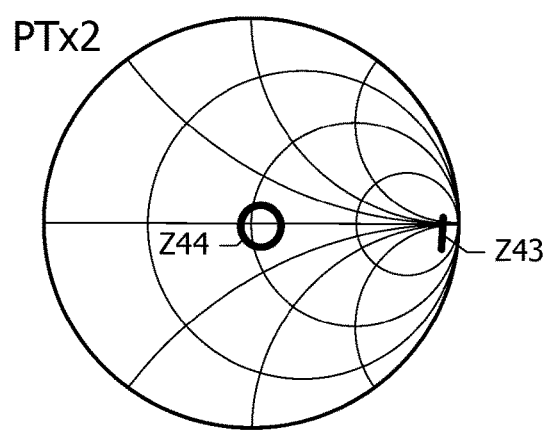
FIG. 11F is a graph on a Smith chart illustrating impedance Z43 and Z44 in terms of pass band PTx2.

FIGS. 11C and 11D are graphs on Smith charts illustrating impedance only in terms of the pass band PTx1 of the transmit filter 31Tx. FIGS. 11E and 11F are graphs on Smith charts illustrating impedance only in terms of the pass band PTx2 of the transmit filter 32Tx.

FIG. 11C is a graph on a Smith chart illustrating impedance Z41 of the transmit filter 31Tx and impedance Z42 of the transmit filter 32Tx with respect to the pass band PTx1 as seen from the branching point 62 of the sending transmission line 60 without necessarily the series inductor 111 (FIG. 11A). FIG. 11D is a graph on a Smith chart illustrating impedance Z43 of the transmit filter 31Tx and impedance Z44 of the transmit filter 32Tx with respect to the pass band PTx1 as seen from the branching point 62 of the sending transmission line 60 having the series inductor 111 connected thereto (FIG. 11B). FIG. 11E is a graph on a Smith chart illustrating impedance Z41 of the transmit filter 31Tx and impedance Z42 of the transmit filter 32Tx with respect to the pass band PTx2 as seen from the branching point 62 of the sending transmission line 60 without necessarily the series inductor 111 (FIG. 11A). FIG. 11F is a graph on a Smith chart illustrating impedance Z43 of the transmit filter 31Tx and impedance Z44 of the transmit filter 32Tx with respect to the pass band PTx2 as seen from the branching point 62 of the sending transmission line 60 having the series inductor 111 connected thereto (FIG. 11B).

When the transmit terminals of the two transmit filters 31Tx and 32Tx are integrated together, the impedance of the transmit filter 31Tx as seen from the branching point 62 with respect to the pass band PTx2 ideally becomes high impedance, while the impedance of the transmit filter 32Tx as seen from the branching point 62 with respect to the pass band PTx1 ideally becomes high impedance. As the impedance deviates from high impedance by a greater amount, it is more difficult to implement desirable impedance matching, thereby increasing the insertion loss.

As one measure to achieve the above-described ideal state, in the second embodiment, the series inductor 111 is inserted in the sending transmission line 60, as shown in FIG. 11B. It is then necessary to adjust the impedance of the transmit filter 31Tx as seen from the branching point 62 with respect to the pass band PTx1 to be desirable impedance (50Ω) and the impedance of the transmit filter 32Tx with respect to the pass band PTx1 to be high impedance. It is also necessary to adjust the impedance of the transmit filter 32Tx as seen from the branching point 62 with respect to the pass band PTx2 to be desirable impedance (50Ω) and the impedance of the transmit filter 31Tx with respect to the pass band PTx2 to be high impedance. In the second embodiment, the impedance of each transmit filter as seen from the branching point 62 is adjusted to be low impedance by factoring in the impedance of the other transmit filter as seen from the branching point 62. This makes it possible to adjust the impedance of the transmit filter 31Tx with respect to the pass band PTx1 and that of the transmit filter 32Tx with respect to the pass band PTx2 to be desirable impedance (50Ω) when the transmit terminals of the transmit filters 31Tx and 32Tx are integrated together. This will be explained below.

Without necessarily the series inductor 111, as shown in FIG. 11C, the impedance Z41 of the transmit filter 31Tx with respect to the pass band PTx1 is slightly higher than the characteristic impedance and is capacitive, as in the input impedance Z31 shown in FIG. 10B. The impedance Z42 of the other transmit filter 32Tx with respect to the pass band PTx1 has a smaller resistance component and a larger capacitance component than the impedance Z41. The impedance Z41 and the impedance Z42 are both located in the fourth quadrant of the Smith chart.

With the series inductor 111, unlike the impedance Z41 (FIG. 11C), the impedance Z43 of the transmit filter 31Tx as seen from the branching point 62 with respect to the pass band PTx1 is located in the vicinity of the center of the Smith chart, as shown in FIG. 11D. Unlike the impedance Z42 (FIG. 11C), the impedance Z44 of the transmit filter 32Tx as seen from the branching point 62 via the series inductor 111 is located in the vicinity of the impedance infinite point of the Smith chart, as shown in FIG. 11D.

Without necessarily the series inductor 111, as shown in FIG. 11E, the impedance Z42 of the transmit filter 32Tx with respect to the pass band PTx2 is slightly lower than the characteristic impedance and is capacitive, as in the input impedance Z32 shown in FIG. 10C. The impedance Z41 of the other transmit filter 31Tx has a smaller resistance component and a smaller capacitance component than the impedance Z42. The impedance Z41 and the impedance Z42 are both located in the third quadrant of the Smith chart.

With the series inductor 111, unlike the impedance Z42 (FIG. 11E), the impedance Z44 of the transmit filter 32Tx as seen from the branching point 62 with respect to the pass band PTx2 is located in the vicinity of the center of the Smith chart, as shown in FIG. 11F. Unlike the impedance Z41 (FIG. 11E), the impedance Z43 of the transmit filter 31Tx as seen from the branching point 62 is located in the vicinity of the impedance infinite point of the Smith chart, as shown in FIG. 11F.

As described above, in the second embodiment, the impedance Z43 of the transmit filter 31Tx as seen from the branching point 62 with respect to the pass band PTx1 matches the characteristic impedance, and the impedance Z43 with respect to the pass band PTx2 is high impedance. Likewise, the impedance Z44 of the transmit filter 32Tx as seen from the branching point 62 with respect to the pass band PTx2 matches the characteristic impedance, and the impedance Z44 with respect to the pass band PTx1 is high impedance. These characteristics correspond to the impedance characteristics shown in FIG. 1B.

A description will now be given of the desirable conditions for making the impedance Z43 with respect to the pass band PTx1 match the characteristic impedance and the impedance Z43 with respect to the pass band PTx2 become high impedance and for making the impedance Z44 with respect to the pass band PTx2 match the characteristic impedance and the impedance Z44 with respect to the pass band PTx1 become high impedance.

The input impedance Z31 of the transmit filter 31Tx (FIG. 10A) with respect to the pass band PTx1 can be set to be slightly higher than the characteristic impedance 50Ω, as shown in FIG. 10B. However, if the input impedance Z31 is much higher than 50Ω, it is difficult to implement impedance matching. The input impedance Z31 can be set to be 60Ω at the highest. Typically, the input impedance Z31 with respect to the pass band PTx1 can be set to be higher than the characteristic impedance and the highest input impedance Z31 is 1.2 times as high as the characteristic impedance.

The input impedance Z32 of the transmit filter 32Tx (FIG. 10A) with respect to the pass band PTx2 can be set to be slightly lower than the characteristic impedance 50Ω, as shown in FIG. 10C. However, if the input impedance Z32 is much lower than 50Ω, it is difficult to implement impedance matching. The input impedance Z32 can be set to be 40Ω at the lowest. Typically, the input impedance Z32 with respect to the pass band PTx2 can be set to be lower than the characteristic impedance and the lowest input impedance Z32 is 0.8 times as high as the characteristic impedance.

Although the series inductor 111 (FIG. 10A) is connected to the transmit filter 32Tx in the second embodiment, it may be connected to the transmit filter 31Tx in accordance with the input impedance of each of the transmit filters 31Tx and 32Tx to be integrated together. A series inductor may be connected to each of the transmit filters 31Tx and 32Tx.

In the second embodiment, a signal to be input into the transmit filter 31Tx having the input impedance Z31, which is higher than the characteristic impedance of the sending transmission line 60, with respect to the pass band PTx1 does not pass through the series inductor 111 (FIG. 10A). In other words, a signal to be input into the transmit filter 31Tx is totally reflected from the series inductor 111. In contrast, a signal to be input into the transmit filter 32Tx having the input impedance Z32, which is lower than the characteristic impedance of the sending transmission line 60, with respect to the pass band PTx2 passes through the series inductor 111.

Third Embodiment

A transmit/receive module 100 according to a third embodiment will be described below with reference to FIGS. 12A through 13F. An explanation of the elements having the same configurations as those of the transmit/receive module 100 of the first embodiment will be omitted.

Figure 12A:
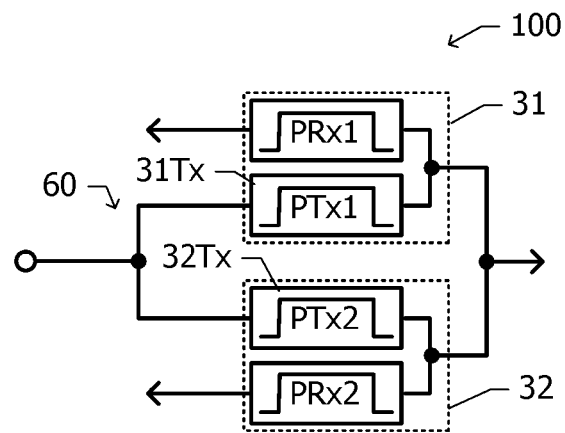
FIG. 12A is a block diagram illustrating the connection state of two duplexers of a transmit/receive module according to a comparative example.

FIG. 12A is a block diagram illustrating the connection state of two duplexers 31 and 32 of a transmit/receive module 100 according to a comparative example. As in the first embodiment, the transmit terminals of the two transmit filters 31Tx and 32Tx are integrated together and connected to the sending transmission line 60.

Figure 12B:
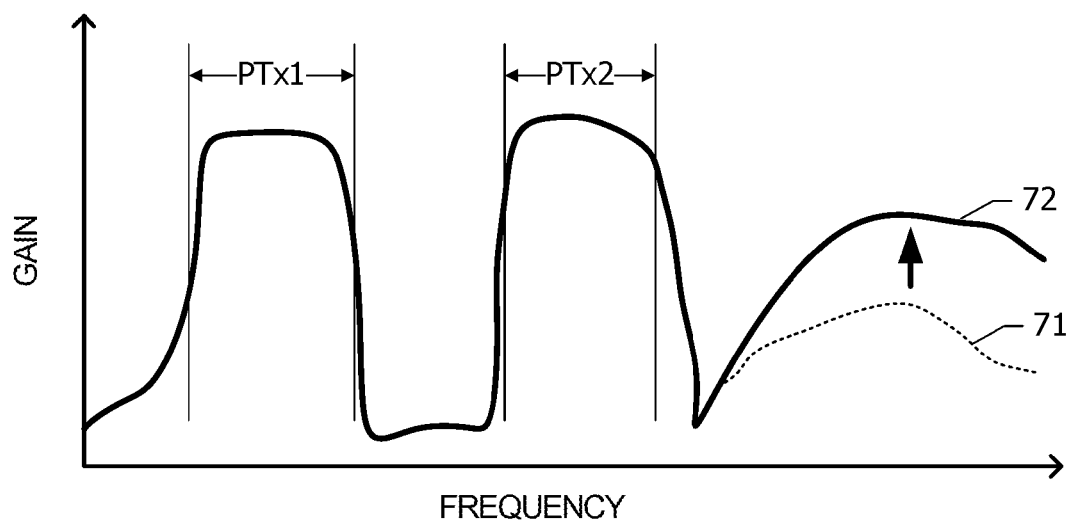
FIG. 12B is a graph illustrating the bandpass characteristics of two transmit filters.

FIG. 12B is a graph illustrating the bandpass characteristics of the two transmit filters 31Tx and 32Tx. The horizontal axis indicates the frequency, and the vertical axis indicates the gain. A high level of gain is achieved in the pass band PTx1 of the transmit filter 31Tx and in the pass band PTx2 of the transmit filter 32Tx.

In the frequency range other than the pass bands PTx1 and PTx2, one of the transmit filters 31Tx and 32Tx exhibits lower attenuation (poorer attenuation) characteristics outside the pass bands. In FIG. 12B, in the frequency range higher than the pass bands PTx1 and PTx2, gain 71 representing the higher attenuation characteristics exhibited by one of the transmit filters 31Tx and 32Tx is indicated by the broken line, while gain 72 representing the lower attenuation characteristics exhibited by the other one of the transmit filters 31Tx and 32Tx is indicated by the solid line. The lower attenuation characteristics represented by the gain 72 are caused by integrating the transmit terminals of the two transmit filters 31Tx and 32Tx together. When the transmit filters 31Tx and 32Tx are used together, the attenuation characteristics of harmonic waves of sending signals in the pass bands PTx1 and PTx2 are decreased compared with when the transmit filters 31Tx and 32Tx are individually used.

Figure 13A:
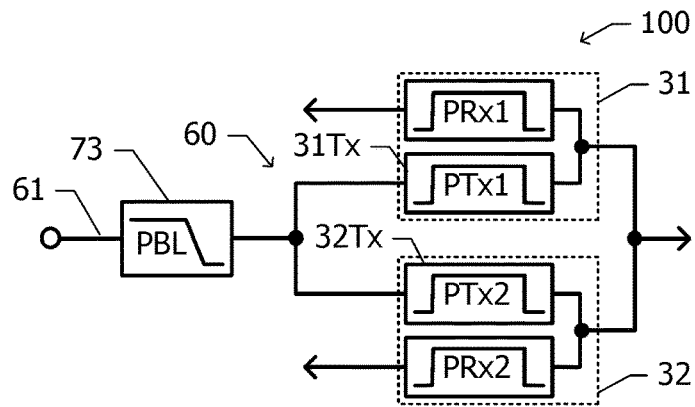
FIG. 13A is a block diagram illustrating the connection state of two duplexers of a transmit/receive module according to a third embodiment.

FIG. 13A is a block diagram illustrating the connection state of two duplexers 31 and 32 of the transmit/receive module 100 according to the third embodiment. A low pass filter 73 is inserted in a common portion 61 of a sending transmission line 60. The pass band of the low pass filter 73 is represented by PBL.

Figure 13B:
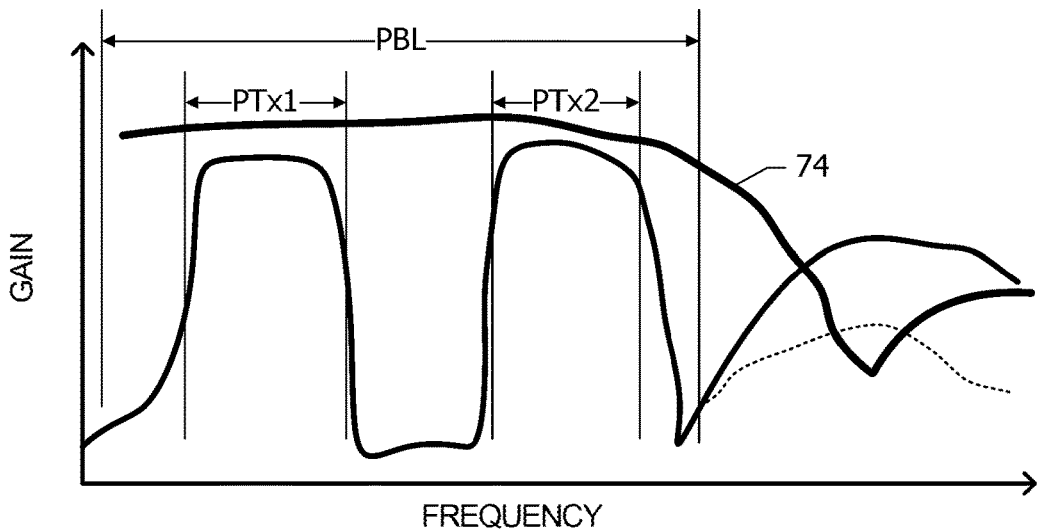
FIG. 13B is a graph illustrating the bandpass characteristics of a low pass filter superposed on the bandpass characteristics of the two transmit filters.
Figure 13C:
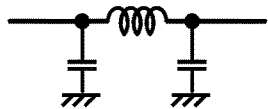
FIGS. 13C through 13F are equivalent circuit diagrams illustrating examples of the low pass filter.
Figure 13D:
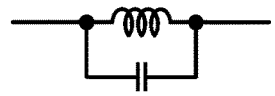
Figure 13E:
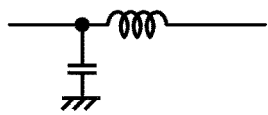
Figure 13F:
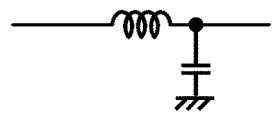

FIG. 13B is a graph illustrating bandpass characteristics 74 of the low pass filter 73 superposed on the bandpass characteristics of the two transmit filters 31Tx and 32Tx. The cutoff frequency of the low pass filter 73 is higher than the highest frequency of the pass bands PTx1 and PTx2 of the transmit filters 31Tx and 32Tx. This prevents the low pass filter 73 from influencing the transmission of sending signals in the pass bands PTx1 and PTx2.

In the frequency bands of the harmonic waves of signals in the pass bands PTx1 and PTx2, the gain of the low pass filter 73 sharply drops. This can compensate for the decreased harmonic-wave attenuation characteristics caused by integrating the transmit terminals of the transmit filters 31Tx and 32Tx together. To sufficiently compensate for the decreased harmonic-wave attenuation characteristics, the cutoff frequency of the low pass filter 73 can be set to be lower than or equal to the frequency corresponding to the second harmonic waves of the lowest frequency of the pass bands PTx1 and PTx2.

FIGS. 13C through 13F are equivalent circuit diagrams illustrating examples of the low pass filter 73. As the low pass filter 73, a π-type filter shown in FIG. 13C, an LC parallel resonance circuit shown in FIG. 13D, or an L-type filter shown in FIG. 13E or 13F may be used.

Fourth Embodiment

A transmit/receive module 100 according to a fourth embodiment will be described below with reference to FIGS. 14A and 14B. An explanation of the elements having the same configurations as those of the transmit/receive module 100 of the first embodiment will be omitted.

Figure 14A:
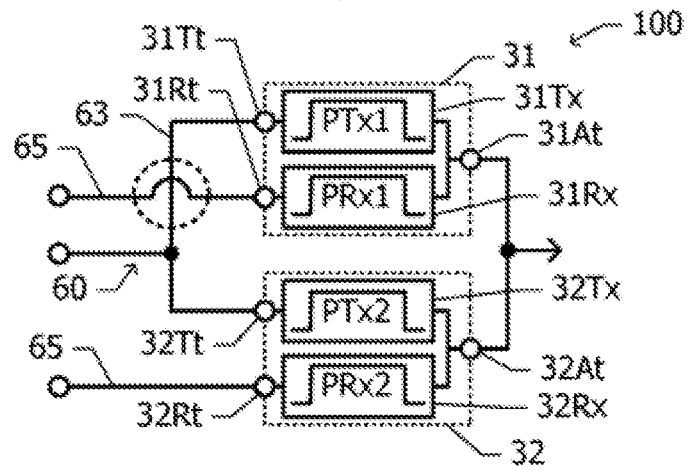
FIG. 14A is a block diagram illustrating the connection state of two duplexers and the arrangement of transmission lines of a transmit/receive module according to a comparative example.

FIG. 14A is a block diagram illustrating the connection state of two duplexers 31 and 32 and the arrangement of transmission lines of a transmit/receive module 100 according to a comparative example. The duplexer 31 has a transmit terminal 31Tt, a receive terminal 31Rt, and an antenna terminal 31At. A signal output from the transmit terminal 31Tt is supplied to a transmit filter 31Tx, and a received signal having passed through a receive filter 31Rx is output from the receive terminal 31Rt. A sending signal having passed through the transmit filter 31Tx is output from the antenna terminal 31At, and a received signal received by the antenna 54 (FIG. 1A) is input into the antenna terminal 31At.

The duplexer 32 also has a transmit terminal 32Tt, a receive terminal 32Rt, and an antenna terminal 32At. The positional relationship among the transmit terminal 31Tt, the receive terminal 31Rt, and the antenna terminal 31At of the duplexer 31 is identical to that among the transmit terminal 32Tt, the receive terminal 32Rt, and the antenna terminal 32At of the duplexer 32, as viewed from above (in a direction perpendicular to the surface of the mounting substrate 67).

Typically, the duplexers 31 and 32 are mounted on a mounting substrate so that the transmit terminal 31Tt and the receive terminal 31Rt of the duplexer 31 and the transmit terminal 32Tt and the receive terminal 32Rt of the duplexer 32 are aligned along an imaginary line. The receive terminal 31Rt is disposed between the transmit terminal 31Tt of the duplexer 31 and the transmit terminal 32Tt of the duplexer 32.

As viewed from above, an individual portion 63 of a sending transmission line 60, which is used for both the transmit filters 31Tx and 32Tx and is connected to the transmit terminals 31Tt and 32Tt, intersects with a receiving transmission line 65 connected to the receive terminal 31Rt. At this intersecting portion, the sending transmission line 60 and the receiving transmission line 65 are electromagnetically coupled with each other, thereby decreasing the isolation therebetween. In the following fourth embodiment, the isolation between the sending transmission line 60 and the receiving transmission line 65 is less degraded.

Figure 14B:
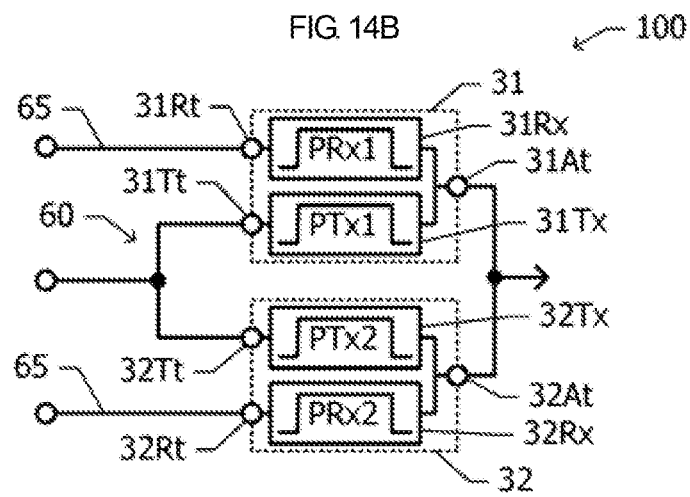
FIG. 14B is a block diagram illustrating the connection state of two duplexers and the arrangement of transmission lines of a transmit/receive module according to a fourth embodiment.

FIG. 14B is a block diagram illustrating the connection state of two duplexers 31 and 32 and the arrangement of transmission lines of a transmit/receive module 100 according to the fourth embodiment.

In the fourth embodiment, the positional relationship among the transmit terminal 31Tt, the receive terminal 31Rt, and the antenna terminal 31At of the duplexer 31 is mirror-symmetrical to that among the transmit terminal 32Tt, the receive terminal 32Rt, and the antenna terminal 32At of the duplexer 32, as viewed from above. The duplexers 31 and 32 are mounted on a mounting substrate so that the transmit terminals 31Tt and 32Tt are positioned adjacent to each other when the transmit terminal 31Tt and the receive terminal 31Rt of the duplexer 31 and the transmit terminal 32Tt and the receive terminal 32Rt of the duplexer 32 are aligned along an imaginary line. Additionally, the duplexers 31 and 32 are mounted on a mounting substrate so that the sending transmission line 60 and the receiving transmission lines 65 do not intersect with each other, as viewed from above.

Advantages of the fourth embodiment will be described below.

The sending transmission line 60 and the receiving transmission lines 65 do not intersect with each other as viewed from above, and the isolation therebetween is thus less degraded. As a result, the occurrence of a leakage of harmonic waves is less likely to occur.

A first modified example of the fourth embodiment will be described below with reference to FIG. 14C.

Figure 14C:
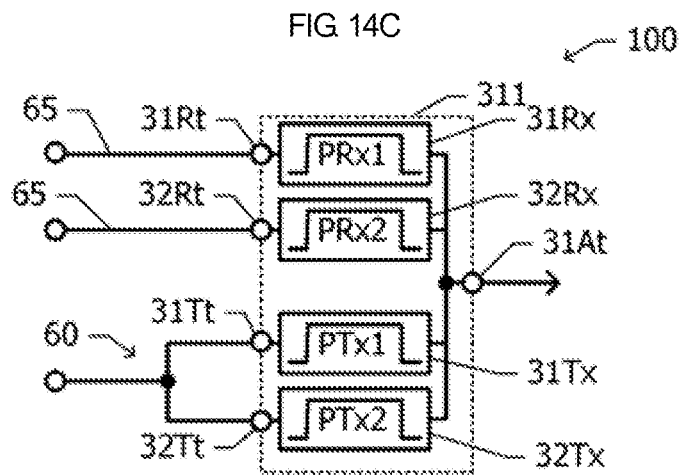
FIG. 14C is a block diagram illustrating the connection state of two duplexers and the arrangement of transmission lines of a transmit/receive module according to a first modified example of the fourth embodiment.

FIG. 14C is a block diagram illustrating a quadplexer 311 of a transmit/receive module 100 and the arrangement of a sending transmission line 60 and receiving transmission lines 65 connected to the quadplexer 311 according to the first modified example of the fourth embodiment. The quadplexer 311 includes two transmit filters 31Tx and 32Tx and two receive filters 31Rx and 32Rx. The quadplexer 311 has two transmit terminals 31Tt and 32Tt, two receive terminals 31Rt and 32Rt, and one antenna terminal 31At.

As viewed from above, neither of the receive terminal 31Rt nor the receive terminal 32Rt is disposed between the two transmit terminals 31Tt and 32Tt, and the sending transmission line 60 connected to the two transmit terminals 31Tt and 32Tt and the receiving transmission lines 65 connected to the two receive terminals 31Rt and 32Rt do not intersect with each other. With this arrangement, in the first modified example, as well as in the fourth embodiment (FIG. 14B), the isolation between the sending transmission line 60 and the receiving transmission lines 65 is less degraded.

A second modified example of the fourth embodiment will be described below with reference to FIGS. 15A and 15B.

Figure 15A:
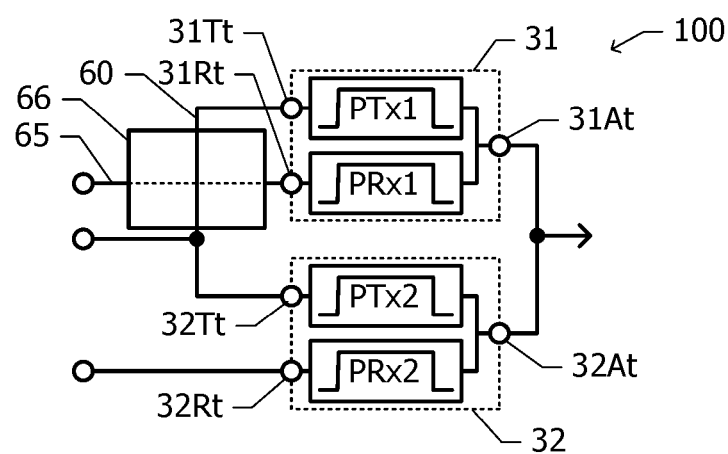
FIG. 15A is a block diagram illustrating the connection state of two duplexers and the arrangement of transmission lines of a transmit/receive module according to a second modified example of the fourth embodiment.

FIG. 15A is a block diagram illustrating the connection state of two duplexers 31 and 32 and the arrangement of transmission lines of a transmit/receive module 100 according to the second modified example of the fourth embodiment. In the second modified example, as well as in the comparative example shown in FIG. 14A, the positional relationship among the transmit terminal 31Tt, the receive terminal 31Rt, and the antenna terminal 31At of the duplexer 31 is identical to that among the transmit terminal 32Tt, the receive terminal 32Rt, and the antenna terminal 32At of the duplexer 32, as viewed from above. Accordingly, the sending transmission line 60 and the receiving transmission line 65 intersect with each other, as viewed from above.

At this intersecting portion, the sending transmission line 60 and the receiving transmission line 65 are disposed at different positions in the thickness direction of a mounting substrate. A ground plane 66 is disposed at the intersecting portion between the sending transmission line 60 and the receiving transmission line 65.

Figure 15B:
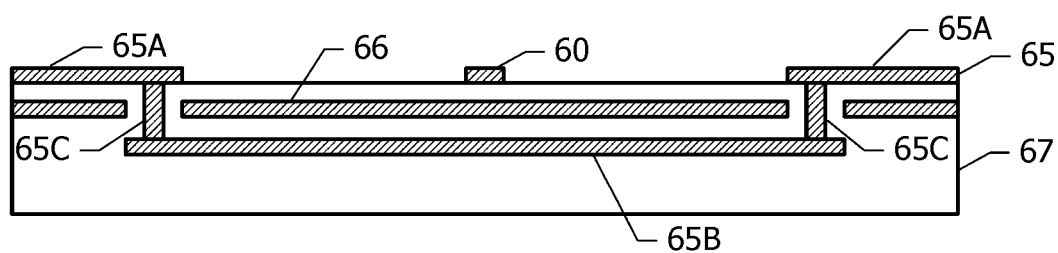
FIG. 15B is a sectional view of an intersecting portion between a sending transmission line and a receiving transmission line.

FIG. 15B is a sectional view of the intersecting portion between the sending transmission line 60 and the receiving transmission line 65. The receiving transmission line 65 is constituted by two first portions 65A, two via-conductors 65C, and one second portion 65B. On the surface of a mounting substrate 67, the sending transmission line 60 and the first portions 65A of the receiving transmission line 65 are disposed. The two first portions 65A are separated at the intersecting portion between the sending transmission line 60 and the receiving transmission line 65. The separated first portions 65A are connected with each other via the second portion 65B and the two via-conductors 65C disposed within the mounting substrate 67.

The ground plane 66 is disposed between the sending transmission line 60 provided on the surface of the mounting substrate 67 and the second portion 65B provided within the mounting substrate 67. The ground plane 66 serves as a shielding layer that reduces electromagnetic coupling between the sending transmission line 60 and the receiving transmission line 65.

In the second modified example of the fourth embodiment, although the sending transmission line 60 and the receiving transmission line 65 intersect with each other as viewed from above, the ground plane 66 serving as a shielding layer is disposed at the intersecting portion between the sending transmission line 60 and the receiving transmission line 65, and the isolation therebetween is thus less degraded.

Fifth Embodiment

A transmit/receive module 100 according to a fifth embodiment will be described below with reference to FIG. 16. An explanation of the elements having the same configurations as those of the transmit/receive module 100 of the first embodiment will be omitted.

Figure 16:
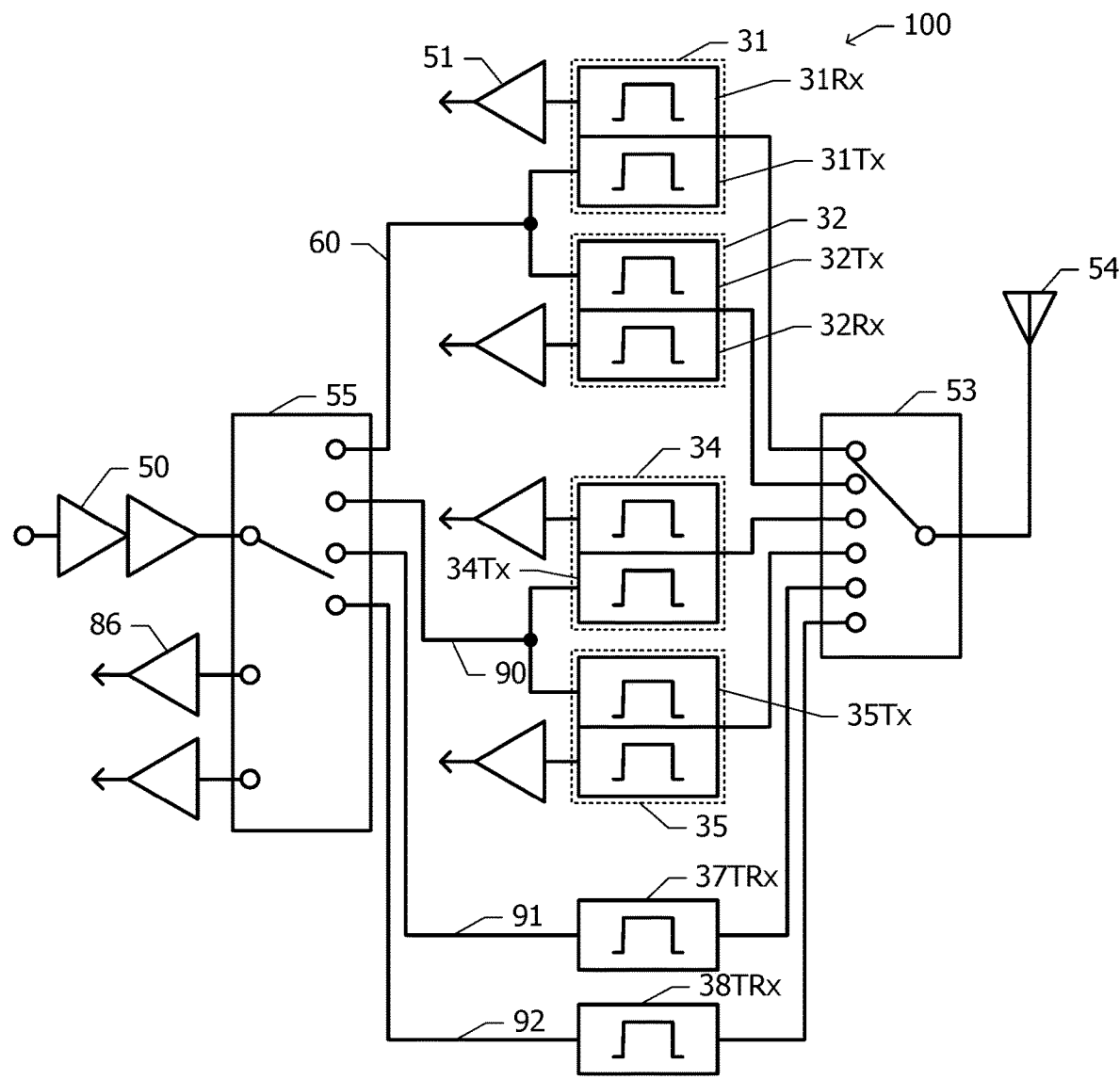
FIG. 16 is a block diagram of a transmit/receive module according to a fifth embodiment.

FIG. 16 is a block diagram of a transmit/receive module 100 according to the fifth embodiment. The transmit/receive module 100 of the first embodiment includes the two duplexers 31 and 32 (FIG. 1A). The transmit/receive module 100 of the fifth embodiment includes more duplexers, such as four duplexers 31, 32, 34, and 35, and also includes two transmit/receive filters 37TRx and 38TRx. The four duplexers 31, 32, 34, and 35 and the two transmit/receive filters 37TRx and 38TRx cover different LTE bands. The LTE bands covered by the four duplexers 31, 32, 34, and 35 are FDM bands, while the LTE bands covered by the two transmit/receive filters 37TRx and 38TRx are TDM bands.

The transmit terminal of the duplexer 31 and that of the duplexer 32 are integrated together and connected to a common sending transmission line 60. The relationship between the pass band and the impedance of each of the duplexers 31 and 32 is similar to that of the transmit/receive module 100 of the first embodiment (FIG. 1A). Likewise, the transmit terminal of the duplexer 34 and that of the duplexer 35 are integrated together and connected to a common sending transmission line 90. The relationship between the pass band and the impedance of each of the duplexers 34 and 35 is also similar to that of the transmit/receive module 100 of the first embodiment (FIG. 1A). Sending/receiving transmission lines 91 and 92 are respectively connected to the transmit/receive terminals of the transmit/receive filters 37TRx and 38TRx.

The output terminal of the power amplifier 50 is connected to one common terminal of a switch 55. Four lines, that is, the sending transmission lines 60 and 90 and the sending/receiving transmission lines 91 and 92, are connected to the respective four contacts of the switch 55. As a result of switching between the contacts of the switch 55, a sending signal output from the power amplifier 50 is selectively supplied to one of a set of the duplexers 31 and 32, a set of the duplexers 34 and 35, the transmit/receive filter 37TRx, and the transmit/receive filter 38TRx.

The receive terminals of the duplexers 31, 32, 34, and 35 are connected to the respective low-noise amplifiers 51.

Received signals having passed through the transmit/receive filters 37TRx and 38TRx are supplied to low-noise amplifiers 86 via the switch 55.

The antenna terminals of the duplexers 31, 32, 34, and 35 and the transmit/receive filters 37TRx and 38TRx are connected to the respective six contacts of an antenna switch 53, which is an SP6T switch. The antenna 54 is connected to the single common terminal of the antenna switch 53.

Advantages of the fifth embodiment will be discussed below.

In the first embodiment, the power amplifier 50 and the two duplexers 31 and 32 are directly connected to each other. "Being directly connected" is defined as follows. If plural elements are directly connected to each other, these elements are connected without necessarily a switch interposed therebetween, but may be connected with another element, such as an impedance matching circuit. In the fifth embodiment, a set of the duplexers 31 and 32, a set of the duplexers 34 and 35, and the transmit/receive filters 37TRx and 38TRx are connected to the power amplifier 50 via the switch 55. This enables the transmit/receive module 100 of the fifth embodiment to support more LTE bands. The transmit terminals of the duplexers 31 and 32 are integrated into one terminal and those of the duplexers 34 and 35 are integrated into one terminal. With this arrangement, fewer contacts are required for the band-changing switch 55. More specifically, the number of contacts is smaller than that of LTE bands (transmit filters), that is, six contacts can be reduced to four. Using fewer contacts can reduce the insertion loss caused by the switch 55.

In the fifth embodiment, as a result of disposing the switch 55 between the power amplifier 50 and a set of the duplexers 31 and 32, a set of the duplexers 34 and 35, and the transmit/receive filters 37TRx and 38TRx, more LTE bands can be covered by the single power amplifier 50 than in the first embodiment. The two duplexers 31 and 32 are integrated together and connected to the common sending transmission line 60, and the two duplexers 34 and 35 are integrated together and connected to the common sending transmission line 90. Hence, the switch 55 does not require the same number of contacts as that of the duplexers. Using fewer contacts can reduce the insertion loss caused by the switch 55. Additionally, with more contacts of a switch, the isolation characteristics between these contacts have to be considered as design parameters. The characteristics of the switch 55 with fewer contacts become less demanding than those of a switch with more contacts.

Sixth Embodiment

A transmit/receive module 100 according to a sixth embodiment will be described below with reference to FIGS. 17A through 17C. An explanation of the elements having the same configurations as those of the transmit/receive module 100 of the first embodiment will be omitted.

Figure 17A:
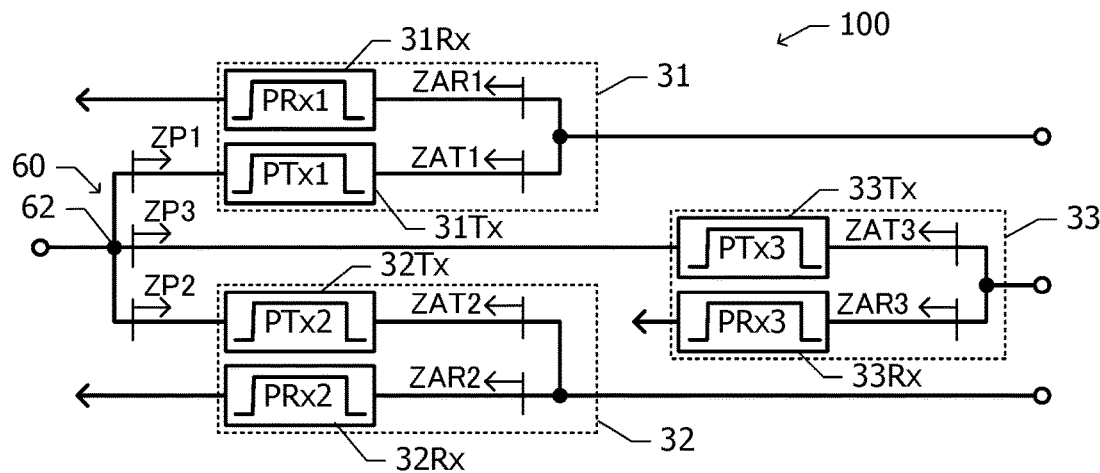
FIG. 17A is a block diagram of a transmit/receive module according to a sixth embodiment.

FIG. 17A is a block diagram of a transmit/receive module 100 according to the sixth embodiment. In the first embodiment, two duplexers 31 and 32 are integrated together and connected to the single sending transmission line 60. In the sixth embodiment, three duplexers 31, 32, and 33 are integrated together and connected to a single sending transmission line 60. The duplexer 33 includes a transmit filter 33Tx and a receive filter 33Rx.

Figure 17B:
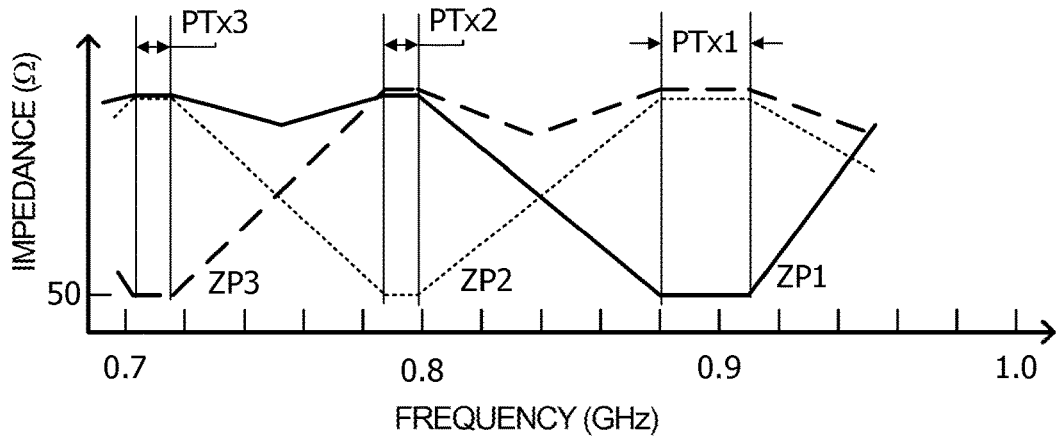
FIG. 17B is a graph illustrating the frequency characteristics of impedance ZP1, ZP2, and ZP3.

FIG. 17B is a graph illustrating the frequency characteristics of impedance ZP1 of the transmit filter 31Tx of the duplexer 31, impedance ZP2 of the transmit filter 32Tx of the duplexer 32, and impedance ZP3 of the transmit filter 33Tx of the duplexer 33, as seen from the branching point 62 of the sending transmission line 60. The horizontal axis indicates the frequency range by the unit GHz, and the vertical axis indicates the absolute value of impedance by the unit 2. The pass bands of the transmit filters 31Tx, 32Tx, and 33Tx are represented by PTx1, PTx2, and PTx3, respectively. FIG. 17B illustrates the impedance frequency characteristics when the duplexers 31, 32, and 33 cover LTE bands 8, 14, and 17, respectively. The pass band PTx1 is 880 to 915 MHz, the pass band PTx2 is 788 to 798 MHz, and the pass band PTx3 is 704 to 716 MHz.

The impedance ZP1, impedance ZP2, and impedance ZP3 of the transmit filters 31Tx, 32Tx, and 33Tx as seen from the branching point 62 with respect to the pass bands PTx1, PTx2, and PTx3, respectively, match the characteristic impedance 50Ω. The impedance ZP1 with respect to the pass bands PTx2 and PTx3 is high impedance. The impedance ZP2 with respect to the pass bands PTx1 and PTx3 is high impedance. The impedance ZP3 with respect to the pass bands PTx1 and PTx2 is high impedance.

Figure 17C:
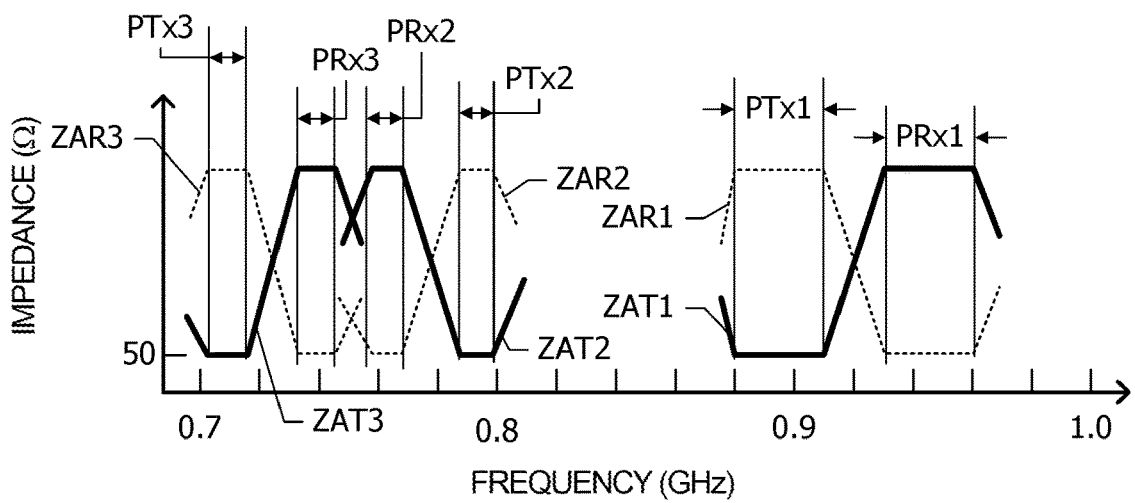
FIG. 17C is a graph illustrating the frequency characteristics of impedance ZAT1, ZAT2, and ZAT3 and those of impedance ZAR1, ZAR2, and ZAR3.

FIG. 17C is a graph illustrating the frequency characteristics of impedance ZAT1 of the transmit filter 31Tx, impedance ZAT2 of the transmit filter 32Tx, and impedance ZAT3 of the transmit filter 33Tx as seen from the antenna terminal and the frequency characteristics of impedance ZAR1 of the receive filter 31Rx, impedance ZAR2 of the receive filter 32Rx, and impedance ZAR3 of the receive filter 33Rx as seen from the antenna terminal. The horizontal axis indicates the frequency range by the unit GHz, and the vertical axis indicates the absolute value of impedance by the unit 2.

The impedance frequency characteristics will be explained from the viewpoint of the transmit filter 31Tx by way of example. The impedance ZAT1 of the transmit filter 31Tx with respect to the pass band 31Tx matches the characteristic impedance, while the impedance ZAT1 with respect to the pass band PRx1 of the receive filter 31Rx is high impedance. The impedance ZAR1 of the receive filter 31Rx with respect to the pass band PRx1 matches the characteristic impedance, while the impedance ZAR1 with respect to the pass band PTx1 of the transmit filter 31Tx is high impedance. The impedance frequency characteristics of the duplexers 32 and 33 are similar to those of the duplexer 31.

Advantages of the sixth embodiment will be discussed below.

In the sixth embodiment, the three duplexers 31, 32, and 33 are connected to the single power amplifier 50 (FIG. 1A) without necessarily a switch interposed therebetween. Signals in three LTE bands can thus be sent and received. The impedance ZP1, impedance ZP2, and impedance ZP3 of the transmit filters 31Tx, 32Tx, and 33Tx as seen from the branching point 62 with respect to the pass bands PTx1, PTx2, and PTx3, respectively, match the characteristic impedance. The impedance ZP1, impedance ZP2, and impedance ZP3 of the transmit filters 31Tx, 32Tx, and 33Tx as seen from the branching point 62 with respect to the pass bands other than the pass bands of their own transmit filters are high impedance. From the viewpoint of each transmit filter, the transmit/receive module 100 is substantially equivalent to a state in which the other transmit filters are not connected. As a result, a sending signal in a certain LTE band can be supplied to the duplexer covering this LTE band with a small insertion loss.

A modified example of the sixth embodiment will be discussed below.

In the sixth embodiment, the three duplexers 31, 32, and 33 are integrated together and connected to the common sending transmission line 60. However, four or more duplexers may be integrated together and connected to the common sending transmission line 60.

Seventh Embodiment

A transmit/receive module 100 according to a seventh embodiment will be described below with reference to FIGS. 18A and 18B. An explanation of the elements having the same configurations as those of the transmit/receive module 100 of the sixth embodiment (FIG. 17A) will be omitted.

Figure 18A:
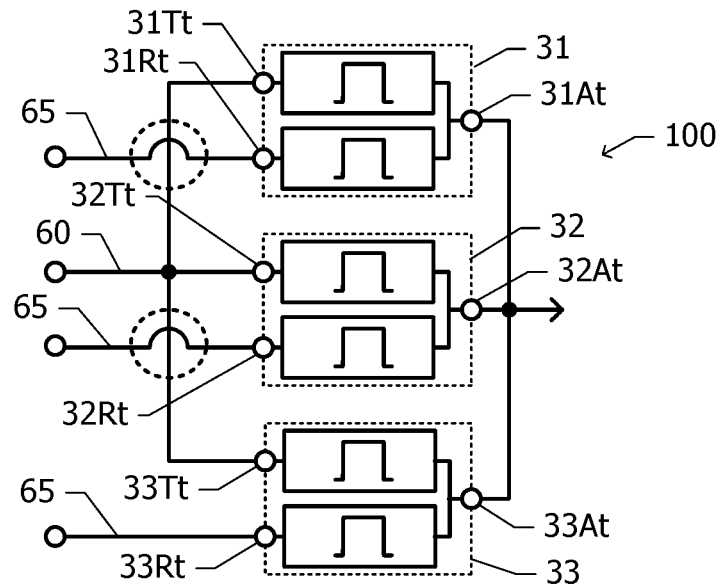
FIG. 18A is a block diagram illustrating the connection state of three duplexers and the arrangement of transmission lines of a transmit/receive module according to a comparative example.

FIG. 18A is a block diagram illustrating the connection state of three duplexers 31, 32, and 33 and the arrangement of transmission lines of a transmit/receive module 100 according to a comparative example. The duplexer 31 has a transmit terminal 31Tt, a receive terminal 31Rt, and an antenna terminal 31At, as in the comparative example shown in FIG. 14A. Similarly, the duplexer 32 has a transmit terminal 32Tt, a receive terminal 32Rt, and an antenna terminal 32At, and duplexer 33 has a transmit terminal 33Tt, a receive terminal 33Rt, and an antenna terminal 33At.

The positional relationship among the transmit terminal, the receive terminal, and the antenna terminal is identical for the three duplexers 31, 32, and 33. The three duplexers 31, 32, and 33 are mounted on a mounting substrate in the same orientation, and the transmit terminals 31Tt, 32Tt, and 33Tt are connected to a common sending transmission line 60. The three receive terminals 31Rt, 32Rt, and 33Rt are connected to the respective receiving transmission lines 65. With such a mounting state, the sending transmission line 60 intersects with the receiving transmission lines 65 in at least two areas, as viewed from above. This decreases the isolation between the sending transmission line 60 and the receiving transmission lines 65.

Figure 18B:
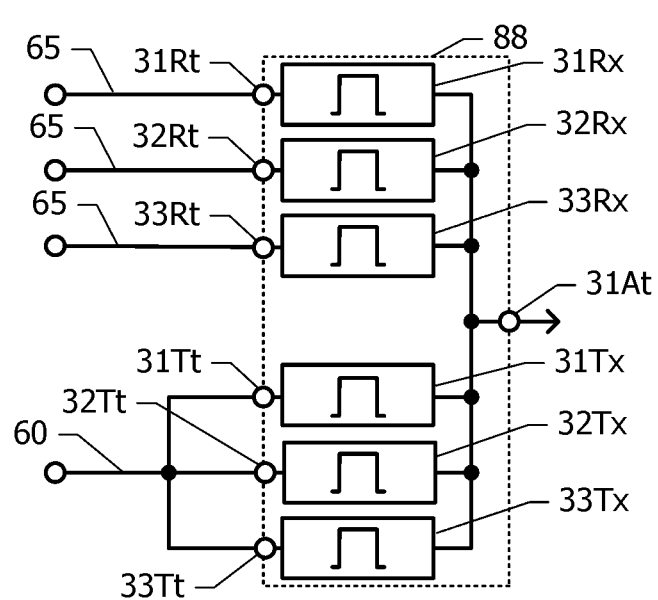
FIG. 18B is a block diagram of a sending/receiving-signals separator circuit used in a transmit/receive module according to a seventh embodiment.

FIG. 18B is a block diagram of a sending/receiving-signals separator circuit 88 used in a transmit/receive module 100 according to the seventh embodiment. The sending/receiving-signals separator circuit 88 has functions of the three duplexers 31, 32, and 33 (FIG. 18A). That is, the sending/receiving-signals separator circuit 88 includes three transmit filters 31Tx, 32Tx, and 33Tx and three receive filters 31Rx, 32Rx, and 33Rx.

The sending/receiving-signals separator circuit 88 includes three transmit terminals 31Tt, 32Tt, 33Tt, three receive terminals 31Rt, 32Rt, and 33Rt, and one antenna terminal 31At. The three transmit terminals 31Tt, 32Tt, and 33Tt are arranged along one imaginary line, and none of the receive terminals 31Rt, 32Rt, and 33Rt are connected between the transmit terminals 31Tt, 32Tt, and 33Tt. The three transmit terminals 31Tt, 32Tt, and 33Tt are integrated and connected to a common sending transmission line 60. The three receive terminals 31Rt, 32Rt, and 33Rt are connected to the respective receiving transmission lines 65. The sending transmission line 60 intersects with none of the receiving transmission lines 65.

Advantages of the seventh embodiment will be discussed below.

In the transmit/receive module 100 of the seventh embodiment, the sending transmission line 60 and the receiving transmission lines 65 do not intersect with each other as viewed from above. As a result, the isolation between the sending transmission line 60 and the receiving transmission lines 65 is less degraded.

Eighth Embodiment

A transmit/receive module 100 according to an eighth embodiment will be described below with reference to FIG. 19. An explanation of the elements having the same configurations as those of the transmit/receive module 100 of the sixth embodiment (FIG. 17A) will be omitted.

Figure 19:
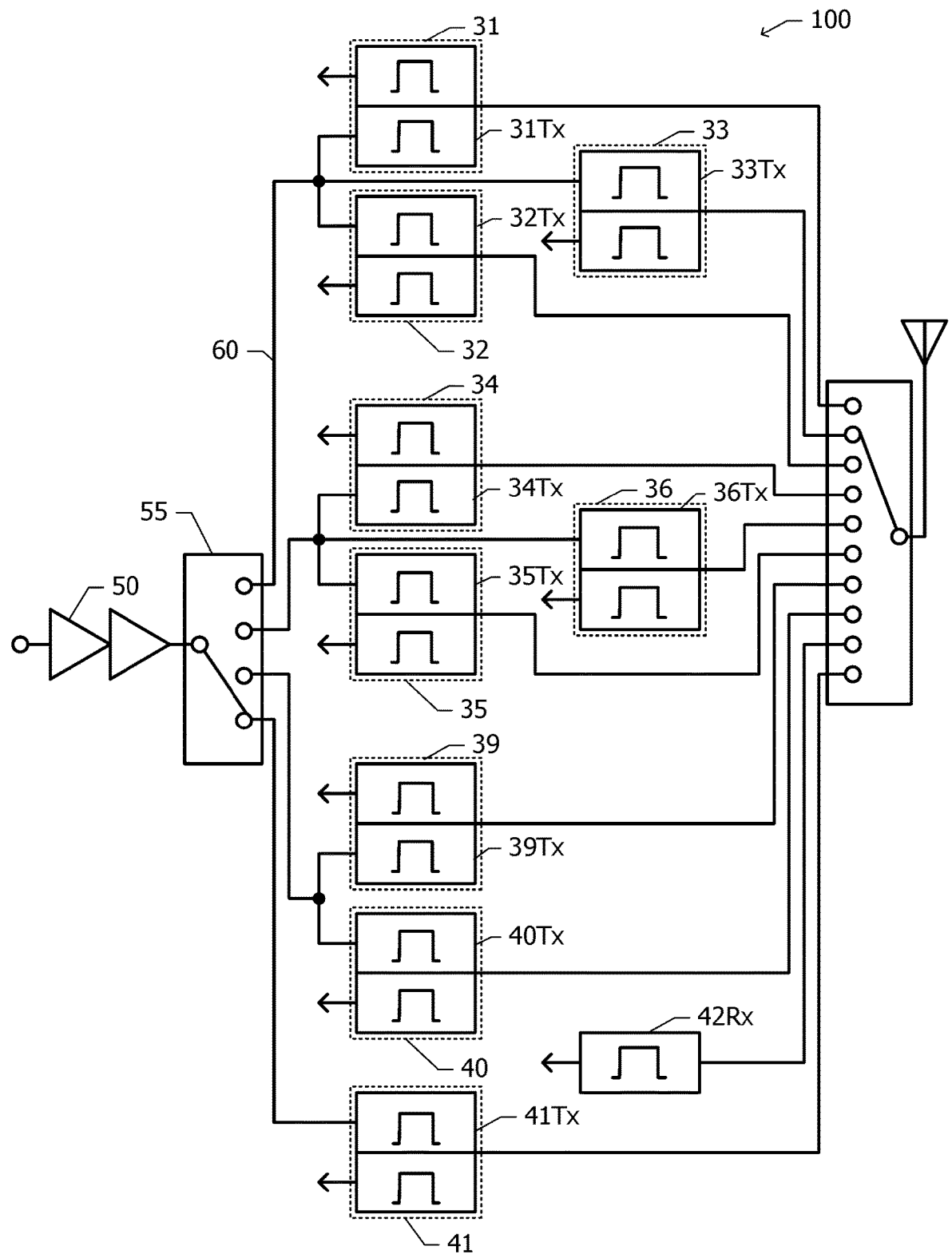
FIG. 19 is a block diagram of a transmit/receive module according to an eighth embodiment.

FIG. 19 is a block diagram of the transmit/receive module 100 according to the eighth embodiment. In the sixth embodiment, the transmit filters 31Tx, 32Tx, and 33Tx of the three duplexers 31, 32, and 33 are integrated and connected to the output terminal of the power amplifier 50 (FIG. 1A) via the common sending transmission line 60. In contrast, in the eighth embodiment, transmit filters 31Tx, 32Tx, and 33Tx of three duplexers 31, 32, and 33 are integrated and connected to one contact of a band-changing switch 55 via a common sending transmission line 60. An SP4T switch is used as the switch 55.

The transmit/receive module 100 of the eighth embodiment also includes six duplexers 34, 35, 36, 39, 40, and 41 and a receive filter 42Rx. Transmit filters 34Tx, 35Tx, and 36Tx of the three duplexers 34, 35, and 36 are integrated and connected to one contact of the switch 55. Transmit filters 39Tx and 40Tx of the two duplexers 39 and 40 are integrated and connected to one contact of the switch 55. A transmit filter 41Tx of the duplexer 41 is singly connected to one contact of the switch 55.

The antenna terminals of the nine duplexers 31, 32, 33, 34, 35, 36, 39, 40, and 41 are connected to nine contacts of an antenna switch 53. One contact of the antenna switch 53 is connected to the antenna terminal of the receive filter 42Rx.

An example of the association between the duplexers and LTE bands are as follows. The three duplexers 31, 32, and 33 connected to one contact of the switch 55 cover LTE bands 8, 14, and 17, respectively. The three duplexers 34, 35, and 36 connected to another contact of the switch 55 cover LTE bands 20, 13, and 12, respectively. The two duplexers 39 and 40 connected to another contact of the switch 55 cover LTE bands 26 and 71, respectively. The duplexer 41 singly connected to one contact of the switch 55 covers LTE band 28. The receive filter 42Rx covers LTE band 29 for supplemental downlink.

The impedance frequency characteristics of the transmit filters 31Tx, 32Tx, and 33Tx of the three duplexers 31, 32, and 33 connected to one contact of the switch 55 as seen from the power amplifier 50 are respectively similar to those of the impedance ZP1, impedance ZP2, and impedance ZP3 (FIGS. 17A and 17B) in the sixth embodiment. The impedance frequency characteristics of the transmit filters 34Tx, 35Tx, and 36Tx of the three duplexers 34, 35, and 36 connected to another contact of the switch 55 as seen from the power amplifier 50 are also respectively similar to those of the impedance ZP1, impedance ZP2, and impedance ZP3 (FIGS. 17A and 17B) in the sixth embodiment.

The impedance frequency characteristics of the transmit filters 39Tx and 40Tx of the two duplexers 39 and 40 connected to another contact of the switch 55 as seen from the power amplifier 50 are similar to those of the impedance ZP1 and impedance ZP2 (FIGS. 1A and 1B) in the first embodiment.

The receive terminals of the receive filters of the multiple duplexers and the receive terminal of the single receive filter 42Rx are connected to the respective low-noise amplifiers (not shown in FIG. 19).

As a result of switching between the contacts of the switch 55, a sending signal output from the power amplifier 50 is selectively supplied to one of a set of the three duplexers 31, 32, and 33, a set of the three duplexers 34, 35, and 36, a set of the two duplexers 39 and 40, and the single duplexer 41.

Advantages of the eighth embodiment will be discussed below.

In the eighth embodiment, as well as in the first embodiment (FIG. 1A) and the sixth embodiment (FIG. 17A), in the same set of duplexers, one duplexer is not substantially influenced by the other duplexers and can operate in its own LTE band under the normal conditions. Additionally, as in the fifth embodiment (FIG. 16), the number of contacts can be reduced to be smaller than that of LTE bands covered by the single power amplifier 50. Using fewer contacts can reduce the insertion loss caused by the switch 55.

A transmit/receive module 100 according to a first modified example of the eighth embodiment will be described below with reference to FIG. 20.

Figure 20:
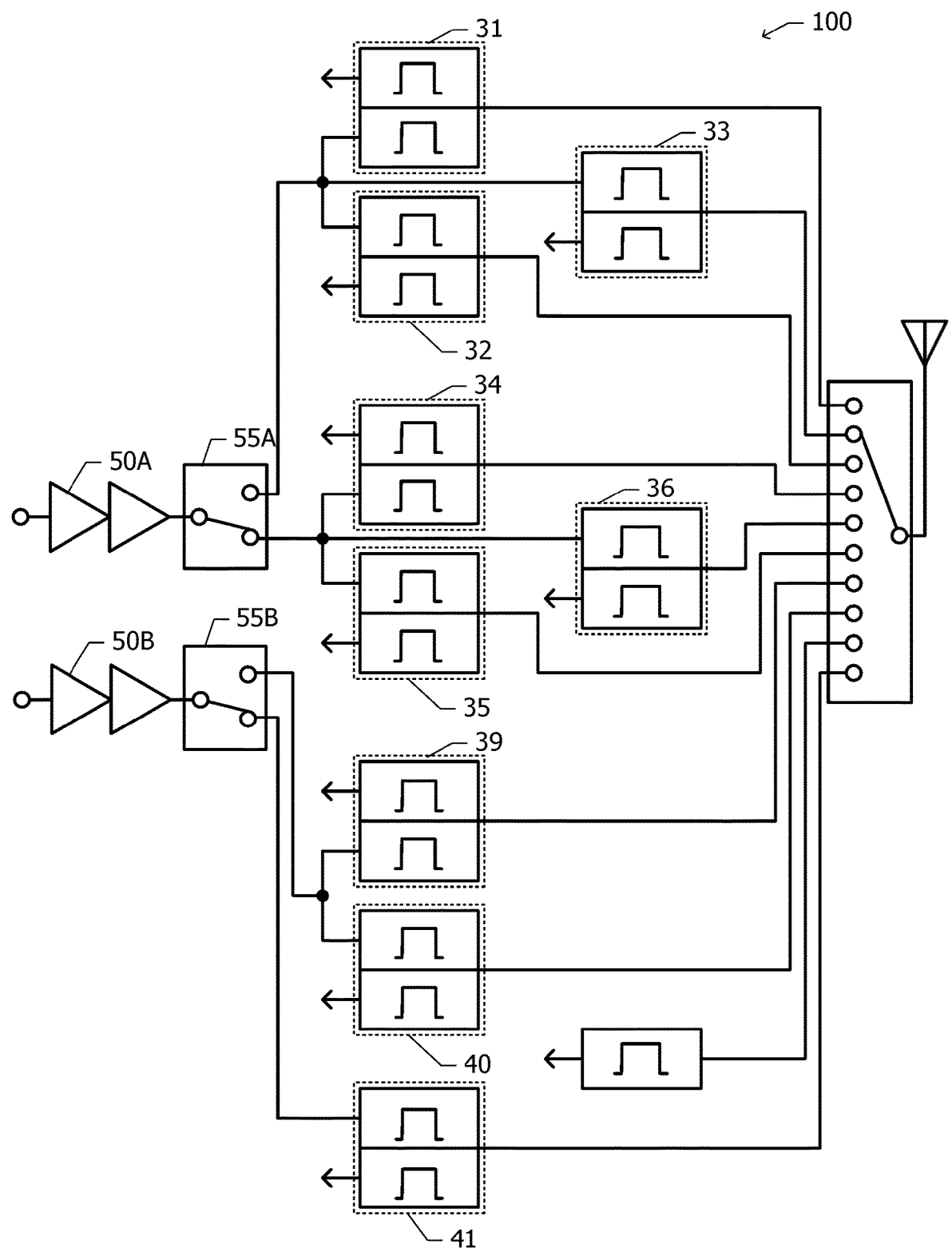
FIG. 20 is a block diagram of a transmit/receive module according to a first modified example of the eighth embodiment.

FIG. 20 is a block diagram of the transmit/receive module 100 according to the first modified example of the eighth embodiment. In the eighth embodiment, an SP4T switch is used as the band-changing switch 55 (FIG. 19). In the first modified example, two SPDT switches 55A and 55B are used. The transmit/receive module 100 of the first modified example includes two power amplifiers 50A and 50B in association with the two SPDT switches 55A and 55B. The output terminals of the power amplifiers 50A and 50B are connected to the respective common terminals of the SPDT switches 55A and 55B.

Three duplexers 31, 32, and 33 are integrated together and connected to one contact of the SPDT switch 55A, while three duplexers 34, 35, and 36 are integrated together and connected to the other contact of the SPDT switch 55A. Two duplexers 39 and 40 are integrated together and connected to one contact of the SPDT switch 55B, while a duplexer 41 is singly connected to the other contact of the SPDT switch 55B.

In the first modified example, the power amplifiers 50A and 50B, each cover fewer LTE bands than the amplifier 50 (FIG. 19) of the eighth embodiment. Accordingly, compared with the power amplifier 50 (FIG. 19), a power amplifier for a narrower band can be used as the power amplifiers 50A and 50B. Additionally, the SPDT switches 55A and 55B, each has fewer contacts than the band-changing switch 55 in the eighth embodiment. This can reduce the insertion loss of the SPDT switches 55A and 55B to be smaller than that of the switch 55 in the eighth embodiment.

A transmit/receive module 100 according to a second modified example of the eighth embodiment will be described below with reference to FIG. 21.

Figure 21:
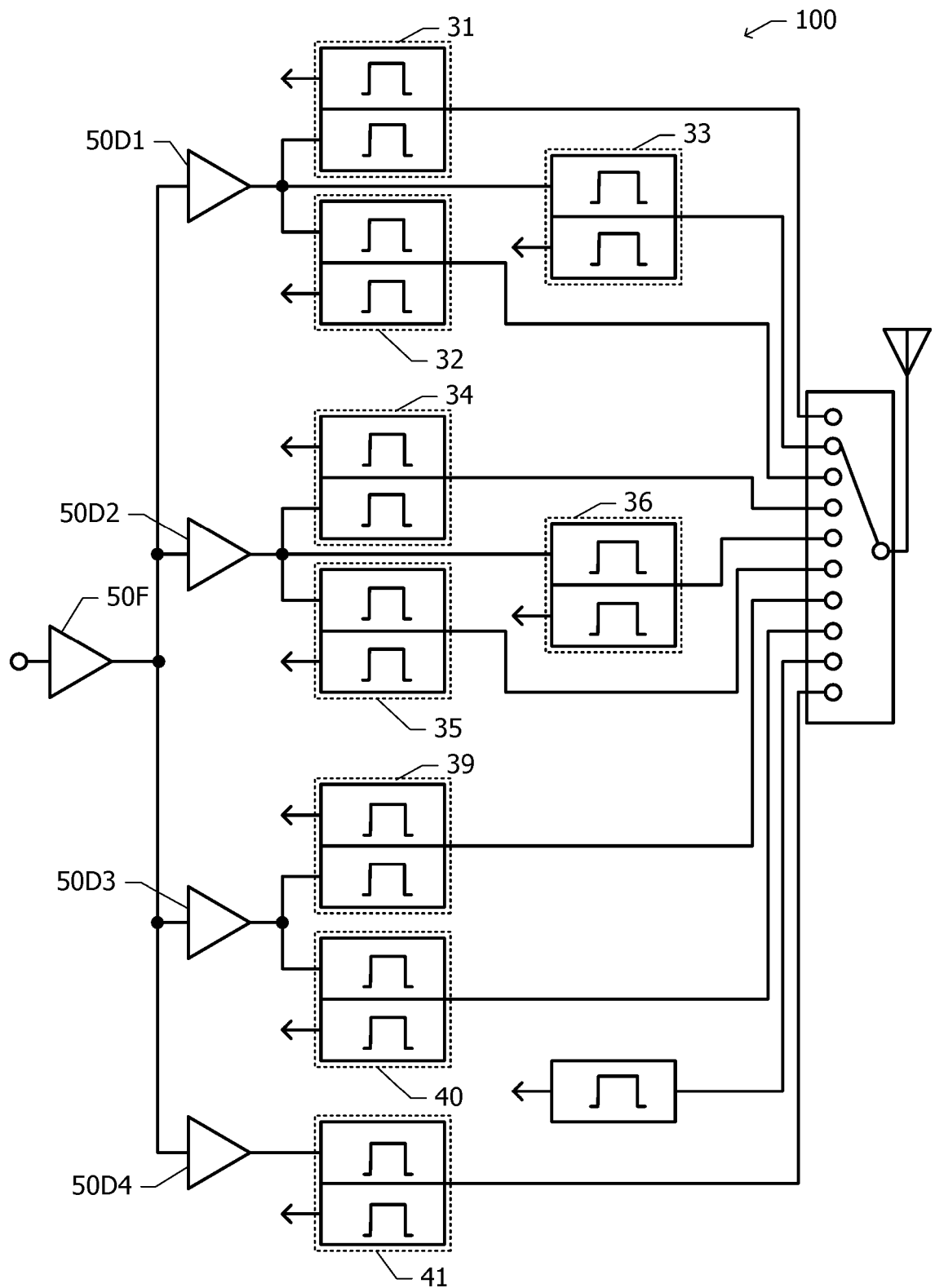
FIG. 21 is a block diagram of a transmit/receive module according to a second modified example of the eighth embodiment.

FIG. 21 is a block diagram of the transmit/receive module 100 according to the second modified example of the eighth embodiment. In the second modified example, a power amplifier 50 is constituted by one initial-stage power amplifier 50F and four output-stage power amplifiers 50D1, 50D2, 50D3, and 50D4. A sending signal output from the initial-stage power amplifier 50F is input into the four output-stage power amplifiers 50D1, 50D2, 50D3, and 50D4.

Three duplexers 31, 32, and 33 are integrated and connected to the output-stage power amplifier 50D1, and three duplexers 34, 35, and 36 are integrated and connected to the output-stage power amplifier 50D2. Two duplexers 39 and 40 are integrated and connected to the output-stage power amplifier 50D3. The duplexer 41 is singly connected to the output-stage power amplifier 50D4.

In the second modified example, the output-stage power amplifiers 50D1, 50D2, 50D3 and 50D4 and the associated duplexers are directly connected to each other without necessarily a switch interposed therebetween. The insertion loss caused by a switch does not occur.

Ninth Embodiment

A transmit/receive module 100 according to a ninth embodiment will be described below with reference to FIGS. 22A, 22B, and 22C. An explanation of the elements having the same configurations as those of the transmit/receive module 100 of the first embodiment (FIGS. 1A through 1C) will be omitted.

Figure 22A:
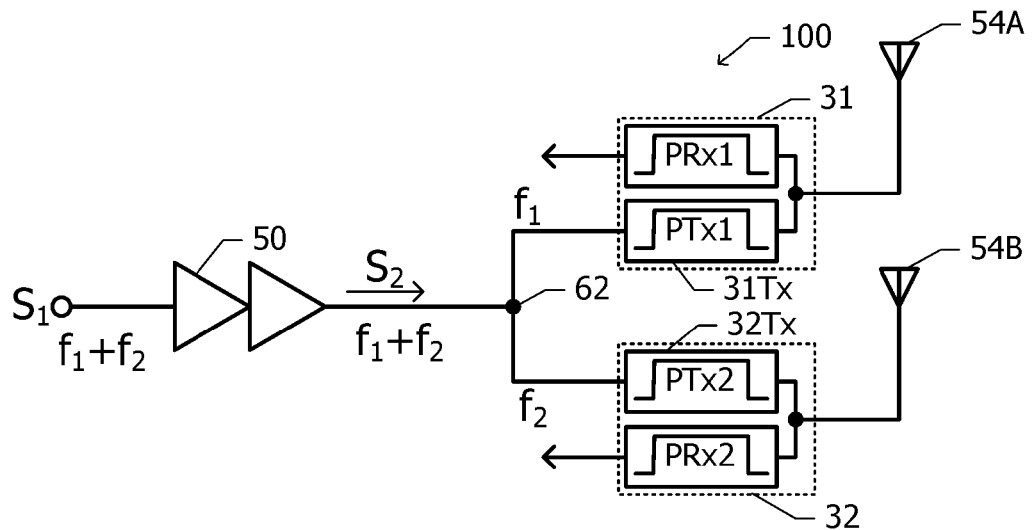
FIG. 22A is a block diagram of a transmit/receive module according to a ninth embodiment.

FIG. 22A is a block diagram of the transmit/receive module 100 according to the ninth embodiment. In the first embodiment, the two duplexers 31 and 32 are connected to the antenna 54 via the antenna switch 53. A signal in the LTE band covered by only one of the duplexers 31 and 32 and selected by the antenna switch 53 is sent and received. In contrast, in the ninth embodiment, antennas 54A and 54B are connected to two duplexers 31 and 32, respectively. This enables the transmit/receive module 100 of the ninth embodiment to support inter-band carrier aggregation for performing data communication by integrating two LTE bands as one communication line.

Figure 22B:
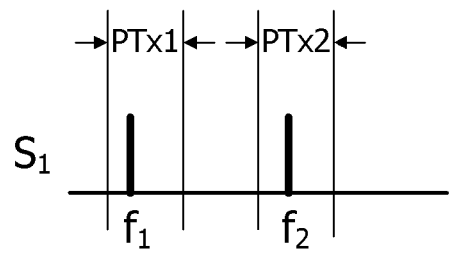
FIG. 22B is a graph illustrating the spectrum of a signal $S_1$ to be input into a power amplifier.

FIG. 22B is a graph illustrating the spectrum of a signal $S_1$ to be input into the power amplifier 50. The signal $S_1$ contains a signal of a frequency $f_1$ within the pass band PTx1 of the transmit filter 31Tx of the duplexer 31 and a signal of a frequency $f_2$ within the pass band PTx2 of the transmit filter 32Tx of the duplexer 32. The power amplifier 50 covers both the pass bands PTx1 and PTx2. The duplexers 31 and 32 respectively cover the LTE bands 3 and 1, for example.

Figure 22C:
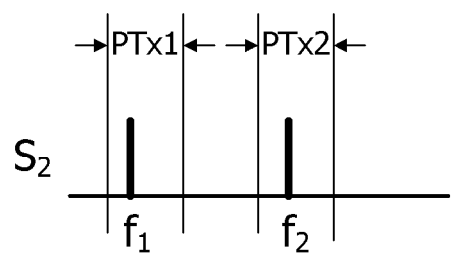
FIG. 22C is a graph illustrating the spectrum of a signal $S_2$ amplified by the power amplifier.

FIG. 22C is a graph illustrating the spectrum of a signal $S_2$ amplified by the power amplifier 50. The power amplifier 50 amplifies both the signal of the frequency $f_1$ and the signal of the frequency $f_2$ and outputs them.

The impedance of the transmit filter 31Tx as seen from the branching point 62 with respect to the pass band PTx1 matches the characteristic impedance, while the impedance of the transmit filter 32Tx as seen from the branching point 62 with respect to the pass band PTx1 is high impedance. That is, the relationship between the impedance and the pass band is similar to that between the impedance ZP1 and impedance ZP2 and the pass bands PTx1 and PTx2 in the transmit/receive module 100 of the first embodiment (FIG. 1A). Hence, the substantially entirety of a signal of the frequency $f_1$ is supplied to the transmit filter 31Tx, while the substantially entirety of a signal of the frequency $f_2$ is supplied to the transmit filter 32Tx.

Advantages of the ninth embodiment will be discussed below.

In the ninth embodiment, a switch is not inserted between the power amplifier 50 and the duplexers 31 and 32, and the single power amplifier 50 can thus support inter-band carrier aggregation using two LTE bands. Although the two duplexers 31 and 32 are integrated together, almost the same level of efficiency as that when the duplexers 31 and 32 are individually operated is achieved. The single power amplifier 50 is also able to handle two sending signals of two LTE bands.

A modified example of the ninth embodiment will be discussed. In the ninth embodiment, the antennas 54A and 54B are connected to the duplexers 31 and 32, respectively. Alternatively, the two duplexers 31 and 32 may share one antenna. In this case, the antenna terminal of the duplexer 31 and that of the duplexer 32 are connected to the single antenna.

Tenth Embodiment

A transmit/receive module 100 according to a tenth embodiment will be described below with reference to FIGS. 23A, 23B, and 23C. An explanation of the elements having the same configurations as those of the transmit/receive module 100 of the ninth embodiment (FIG. 22A) will be omitted.

Figure 23A:
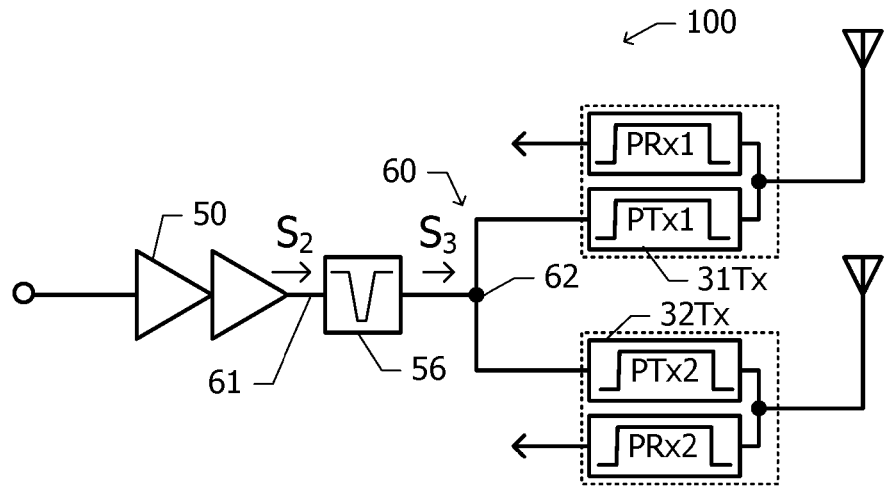
FIG. 23A is a block diagram of a transmit/receive module according to a tenth embodiment.

FIG. 23A is a block diagram of the transmit/receive module 100 according to the tenth embodiment. In the tenth embodiment, a notch filter 56 is inserted in a common portion 61 of a sending transmission line 60 between a power amplifier 50 and a branching point 62.

Figure 23B:
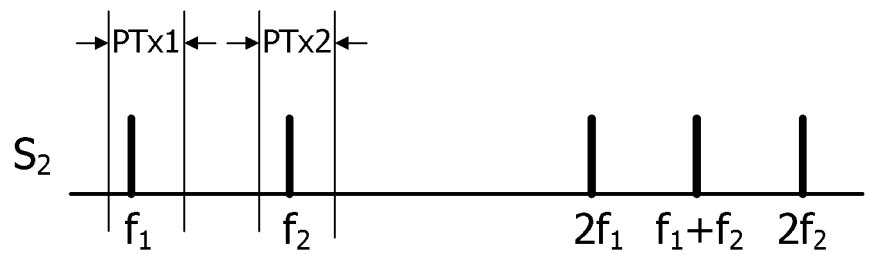
FIG. 23B is a graph illustrating the spectrum of a signal $S_2$ between a power amplifier and a notch filter.

FIG. 23B is a graph illustrating the spectrum of a signal $S_2$ between the power amplifier 50 and the notch filter 56. A signal of a frequency $f_1$ within the pass band PTx1 of the transmit filter 31Tx of the duplexer 31 and a signal of a frequency $f_2$ within the pass band PTx2 of the transmit filter 32Tx of the duplexer 32 are output from the power amplifier 50. The nonlinearity of the power amplifier 50 causes the occurrence of harmonic waves of a signal of the frequency $f_1$ and a signal of the frequency $f_2$. The frequencies of the second harmonic waves are $2f_1$ and $2f_2$. The single power amplifier 50 simultaneously amplifies two signals of different frequencies. This causes the occurrence of a component having a frequency $f_1+f_2$, which corresponds to the product of the two signals.

Figure 23C:
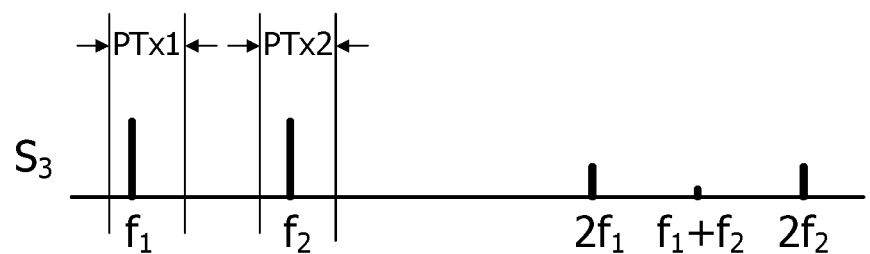
FIG. 23C is a graph illustrating the spectrum of a signal $S_3$ having passed through the notch filter.

FIG. 23C is a graph illustrating the spectrum of a signal $S_3$ having passed through the notch filter 56. The elimination band of the notch filter 56 is equivalent to the frequency $f_1+f_2$. A component having the frequency $f_1+f_2$ contained in the signal $S_2$ is thus attenuated in the notch filter 56 and only negligibly appears in the signal $S_3$. The second harmonic waves of the frequencies $2f_1$ and $2f_2$ are also attenuated.

Advantages of the tenth embodiment will be discussed below.

In the tenth embodiment, frequency components corresponding to the product of signals of two LTE bands used in inter-band carrier aggregation can be reduced. This makes it possible to address the issue which may arise due to the use of the single power amplifier 50 for two LTE bands in inter-band carrier aggregation. The single power amplifier 50 is also able to handle two sending signals of two LTE bands.

In the tenth embodiment, the notch filter 56 is inserted in series with the sending transmission line 60. Alternatively, harmonic wave components of the frequencies $2f_1$ and $2f_2$ and components of the frequency $f_1+f_2$ may be connected to ground.

A modified example of the tenth embodiment will be described below with reference to FIG. 24.

Figure 24:
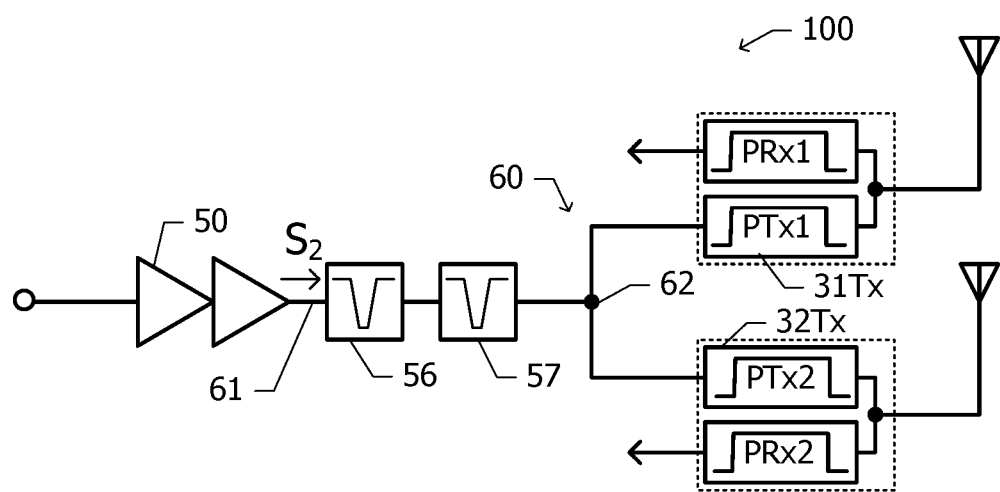
FIG. 24 is a block diagram of a transmit/receive module according to a modified example of the tenth embodiment.

FIG. 24 is a block diagram of a transmit/receive module 100 according to the modified example of the tenth embodiment. In this modified example, in addition to the notch filter 56 for second harmonic waves, a notch filter 57 for third harmonic waves is inserted in the common portion 61 of the sending transmission line 60 between the power amplifier 50 and the branching point 62. The notch filter 57 attenuates third harmonic waves of frequencies $3f_1$ and $3f_2$. This modified example is effective especially when third harmonic waves of the signal $S_2$ output from the power amplifier 50 are strong.

Eleventh Embodiment

A transmit/receive module 100 according to an eleventh embodiment will be described below with reference to FIGS. 25A, 25B, and 25C. An explanation of the elements having the same configurations as those of the transmit/receive module 100 of the ninth embodiment (FIG. 22A) will be omitted.

Figure 25A:
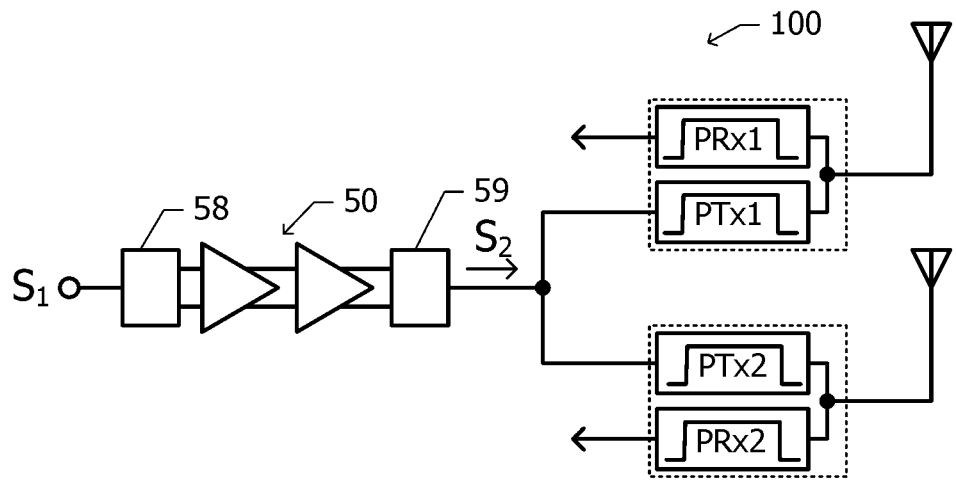
FIG. 25A is a block diagram of a transmit/receive module according to an eleventh embodiment.

FIG. 25A is a block diagram of the transmit/receive module 100 according to the eleventh embodiment. In the eleventh embodiment, a two-stage differential amplifier is used as the power amplifier 50. A phase shifter (balun) 58 is disposed at the stage preceding the power amplifier 50 and is connected thereto. A multiplexer 59 is disposed at the stage following the power amplifier 50 and is connected thereto.

Figure 25B:
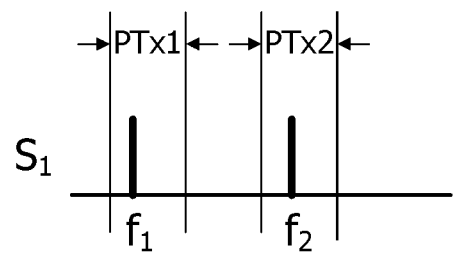
FIG. 25B is a graph illustrating the spectrum of a signal $S_1$ to be input into a phase shifter.

FIG. 25B is a graph illustrating the spectrum of a signal $S_1$ to be input into the phase shifter 58. A signal of a frequency $f_1$ within the pass band PTx1 of the transmit filter 31Tx of the duplexer 31 and a signal of a frequency $f_2$ within the pass band PTx2 of the transmit filter 32Tx of the duplexer 32 are input into the phase shifter 58.

Figure 25C:
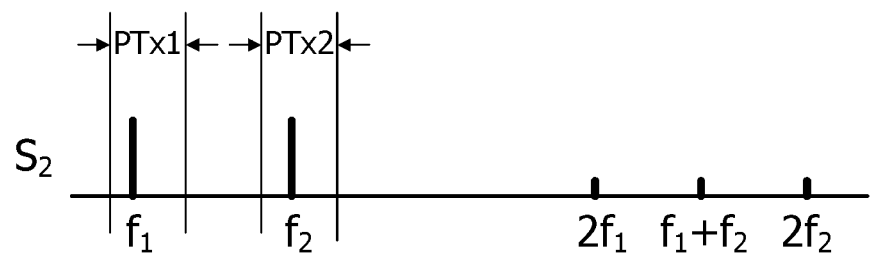
FIG. 25C is a graph illustrating the spectrum of a signal $S_2$ multiplexed by a multiplexer.

FIG. 25C is a graph illustrating the spectrum of a signal $S_2$ multiplexed by the multiplexer 59. The use of a differential amplifier as the power amplifier 50 can reduce the occurrence of second harmonic waves of signals of frequencies $f_1$ and $f_2$ and a signal of a frequency $f_1+f_2$ corresponding to the product of the two signals.

Advantages of the eleventh embodiment will be discussed below.

In the eleventh embodiment, second harmonic waves of signals of two LTE bands used in inter-band carrier aggregation and frequency components corresponding to the product of the two signals can be reduced. This makes it possible to address the issue which may arise due to the use of the single power amplifier 50 for two LTE bands in inter-band carrier aggregation.

A modified example of the eleventh embodiment will be described below with reference to FIG. 26.

Figure 26:
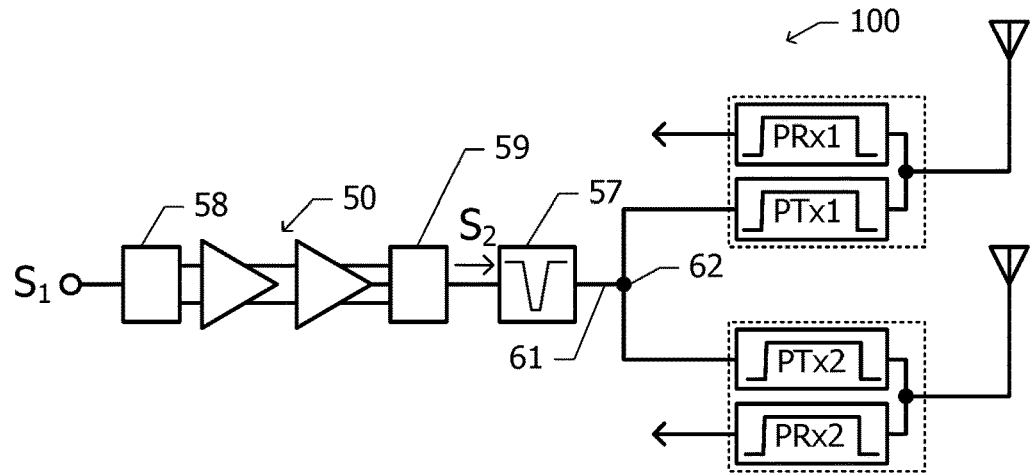
FIG. 26 is a block diagram of a transmit/receive module according to a modified example of the eleventh embodiment.

FIG. 26 is a block diagram of a transmit/receive module 100 according to the modified example of the eleventh embodiment. In this modified example, a notch filter 57 for third harmonic waves is inserted in the common portion 61 of the sending transmission line 60 between the multiplexer 59 and the branching point 62. The notch filter 57 attenuates third harmonic waves of frequencies $3f_1$ and $3f_2$. As well as reducing the occurrence of even-numbered harmonic waves by the differential amplifier, the occurrence of third harmonic waves is also attenuated by the notch filter 57. This modified example is effective especially when third harmonic waves of the signal $S_2$ output from the power amplifier 50 are strong.

Twelfth Embodiment

A transmit/receive module 100 according to a twelfth embodiment will be described below with reference to FIGS. 27A and 27B. An explanation of the elements having the same configurations as those of the transmit/receive module 100 of the ninth embodiment (FIG. 22A) will be omitted.

Figure 27A:
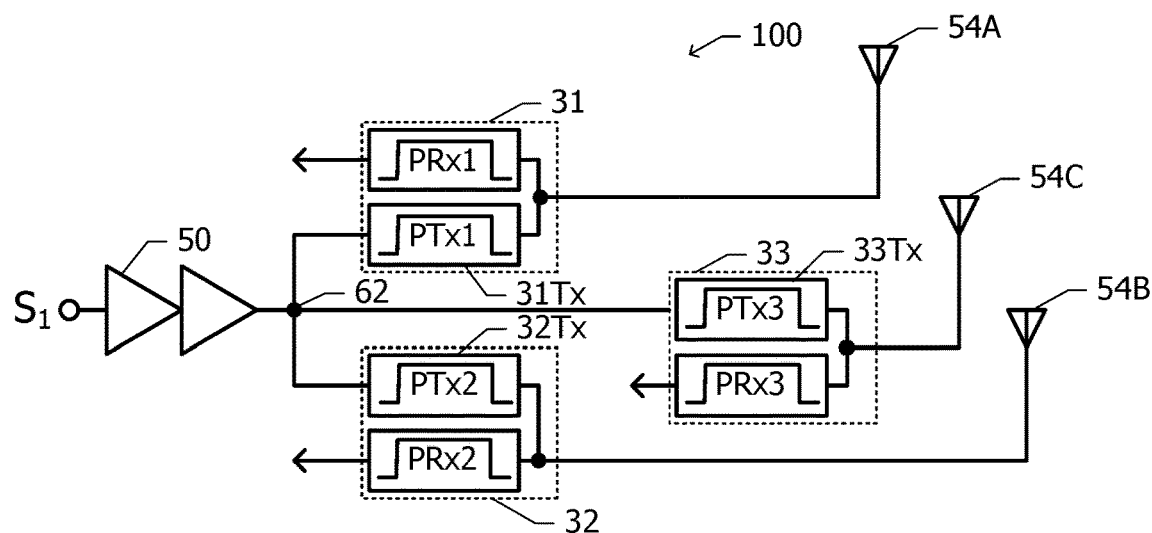
FIG. 27A is a block diagram of a transmit/receive module according to a twelfth embodiment.

FIG. 27A is a block diagram of the transmit/receive module 100 according to the twelfth embodiment. The transmit/receive module 100 of the ninth embodiment is applicable to inter-band carrier aggregation using two LTE bands. The transmit/receive module 100 of the twelfth embodiment is applicable to inter-band carrier aggregation using three LTE bands.

Three duplexers 31, 32, and 33 are integrated together and connected to a single power amplifier 50. The antenna terminals of the three duplexers 31, 32, and 33 are connected to antennas 54A, 54B, and 54C, respectively.

Figure 27B:
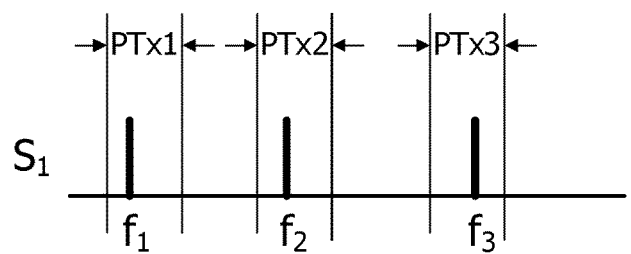
FIG. 27B is a graph illustrating the spectrum of a signal $S_1$ to be input into a power amplifier.

FIG. 27B is a graph illustrating the spectrum of a signal $S_1$ to be input into the power amplifier 50. The signal $S_1$ contains a signal of a frequency $f_1$ within the pass band PTx1 of the transmit filter 31Tx of the duplexer 31, a signal of a frequency $f_2$ within the pass band PTx2 of the transmit filter 32Tx of the duplexer 32, and a signal of a frequency $f_3$ within the pass band PTx3 of the transmit filter 33Tx of the duplexer 33.

Advantages of the twelfth embodiment will be discussed below.

The impedance frequency characteristics of the duplexers 31, 32, and 33 as seen from the branching point 62 of the sending transmission line 60 are similar to those of the duplexers 31, 32, and 33 of the transmit/receive module 100 of the sixth embodiment (FIGS. 17A through 17C). That is, among the duplexers 31, 32, and 33, each duplexer is less likely to be influenced by the other duplexers. This makes it even easier to apply the transmit/receive module 100 of the twelfth embodiment to inter-band carrier aggregation using the single power amplifier 50 for three LTE bands.

Thirteenth Embodiment

A transmit/receive module 100 according to a thirteenth embodiment will be described below with reference to FIGS. 28A and 28B. An explanation of the elements having the same configurations as those of the transmit/receive module 100 of the first embodiment (FIGS. 1A and 4A) will be omitted.

Figure 28A:
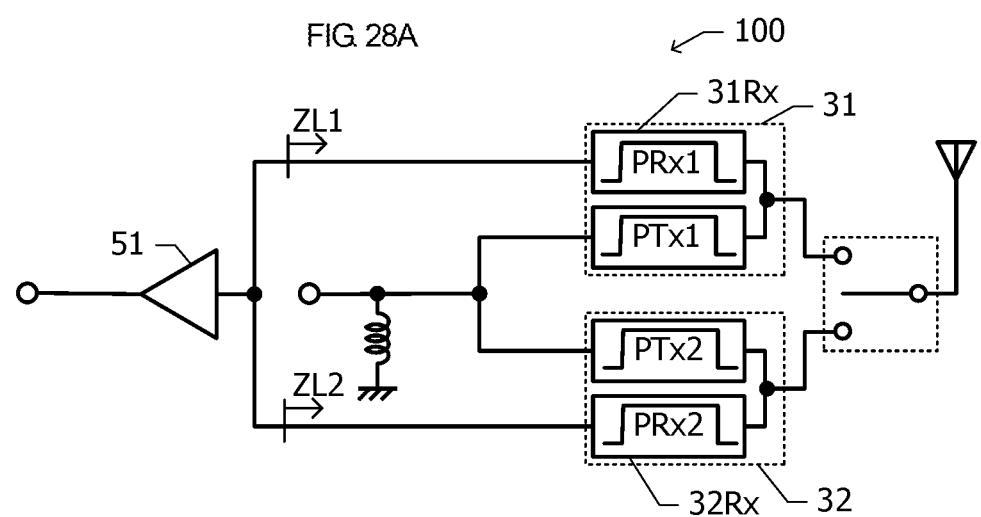
FIG. 28A is a block diagram of a transmit/receive module according to a thirteenth embodiment.

FIG. 28A is a block diagram of the transmit/receive module 100 according to the thirteenth embodiment. In the first embodiment (FIGS. 1A and 4A), the receive filters 31Rx and 32Rx of the two duplexers 31 and 32 are connected to the different low-noise amplifiers 51. In contrast, in the thirteenth embodiment, receive filters 31Rx and 32Rx of two duplexers 31 and 32 are integrated together and connected to a common low-noise amplifier 51.

Figure 28B:
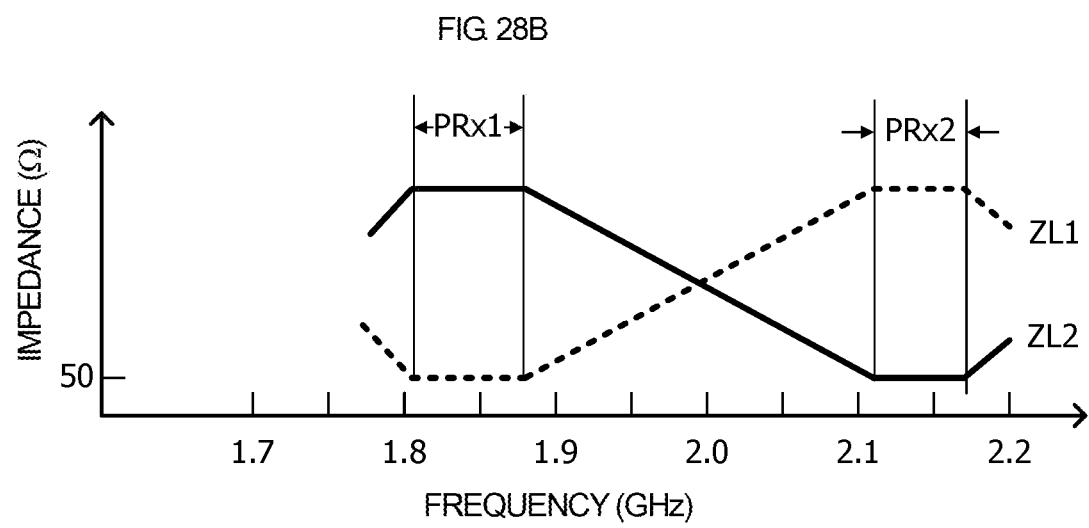
FIG. 28B is a graph illustrating the frequency characteristics of impedance ZL1 and ZL2.

FIG. 28B is a graph illustrating the frequency characteristics of impedance ZL1 of the receive filter 31Rx and impedance ZL2 of the receive filter 32Rx as seen from the low-noise amplifier 51. The impedance ZL1 of the receive filter 31Rx as seen from the low-noise amplifier 51 with respect to the pass band PRx1 of the receive filter 31Rx matches the characteristic impedance 50Ω, while the impedance ZL1 with respect to the pass band PRx2 of the receive filter 32Rx is high impedance. Conversely, the impedance ZL2 of the receive filter 32Rx as seen from the low-noise amplifier 51 with respect to the pass band PRx2 matches the characteristic impedance 50Ω, while the impedance ZL2 with respect to the pass band PRx1 is high impedance.

Advantages of the thirteenth embodiment will be discussed below.

The impedance ZL2 of the receive filter 32Rx becomes high impedance for a received signal having passed through the receive filter 31Rx. This received signal can thus be supplied to the low-noise amplifier 51 substantially without necessarily being influenced by the receive filter 32Rx. Likewise, a received signal having passed through the receive filter 32Rx can be supplied to the low-noise amplifier 51 substantially without necessarily being influenced by the receive filter 31Rx.

In the thirteenth embodiment, the number of low-noise amplifiers 51 can be reduced to be smaller than that of LTE bands used in the transmit/receive module 100.

The above-described embodiments are only examples, and the present disclosure is not restricted thereto. The configurations described in different embodiments may partially be replaced by or combined with each other. Similar advantages obtained by similar configurations in plural embodiments are not repeated in the individual embodiments.

While embodiments of the disclosure have been described above, it is to be understood that variations, modifications, improvements, and combinations will be apparent to those skilled in the art without necessarily departing from the scope and spirit of the disclosure. The scope of the disclosure, therefore, is to be determined solely by the following claims.

What is claimed is:

1. A transmit/receive module comprising:
a plurality of duplexers, each of the plurality of duplexers being configured to operate in different frequency bands and comprising a transmit filter and a receive filter;
a power amplifier configured to amplify a signal having a frequency in a pass band of one of the transmit filters of the plurality of duplexers, and to output an amplified signal; and
a sending transmission line that is simultaneously connected to the plurality of transmit filters, the amplified signal output from the power amplifier being transmitted through the sending transmission line,
wherein the sending transmission line is simultaneously connected between the plurality of transmit filters and the power amplifier, and
wherein an input impedance of a second transmit filter, for frequencies in the pass band of the second transmit filter, is less than the characteristic impedance of the sending transmission line and greater than or equal to 0.8 times the characteristic impedance.

2. The transmit/receive module according to claim 1, wherein:
the sending transmission line comprises a common portion connected to the power amplifier and a plurality of individual portions, each of the plurality of individual portions being connected to a different one of the transmit filters, the plurality of individual portions connecting to the common portion at a branching point; and
an impedance of the plurality of transmit filters as seen from the common portion is the same as a characteristic impedance of the sending transmission line,
an impedance of each transmit filter as seen from the branching point, for frequencies of the pass band of the transmit filter, is the same as the characteristic impedance of the sending transmission line, and
an impedance of each transmit filter as seen from the branching point, for frequencies of the pass band of another transmit filter, is three times or more than the characteristic impedance of the sending transmission line.

3. The transmit/receive module according to claim 2, wherein an input impedance of a first transmit filter, for frequencies in the pass band of the first transmit filter, is greater than the characteristic impedance of the sending transmission line and less than or equal to 1.2 times the characteristic impedance of the sending transmission line.

4. The transmit/receive module according to claim 2, further comprising:
a low pass filter in the sending transmission line at the common portion,
wherein a cutoff frequency of the low pass filter is greater than the highest frequency of the pass bands of the plurality of transmit filters.

5. The transmit/receive module according to claim 2, further comprising:
a low-noise amplifier configured to amplify a signal passed by any of the receive filters of the plurality of duplexers, and to output an amplified signal.

6. The transmit/receive module according to claim 2, further comprising:
a mounting substrate on which the plurality of duplexers and the power amplifier are mounted, the sending transmission line being disposed in or on the mounting substrate; and
a receiving transmission line disposed in or on the mounting substrate, signals having passed through the receive filters of the plurality of duplexers being transmitted through the receiving transmission line,
wherein, when the mounting substrate is seen in a plan view, the sending transmission line and the receiving transmission line do not intersect with each other.

7. The transmit/receive module according to claim 2, further comprising:
a mounting substrate on which the plurality of duplexers and the power amplifier are mounted, the sending transmission line being disposed in or on the mounting substrate; and
a receiving transmission line disposed in or on the mounting substrate, signals having passed through the receive filters of the plurality of duplexers being transmitted through the receiving transmission line,
wherein, when the mounting substrate is seen in a plan view, the sending transmission line and the receiving transmission line intersect with each other at an intersecting portion,
wherein, at the intersecting portion, the sending transmission line and the receiving transmission line are disposed at different thicknesses of the mounting substrate, and
wherein the transmit/receive module further comprises a ground plane disposed at the intersecting portion at a thickness between the sending transmission line and the receiving transmission line.

8. The transmit/receive module according to claim 1, wherein an input impedance of a first transmit filter, for frequencies in the pass band of the first transmit filter, is greater than a characteristic impedance of the sending transmission line and less than or equal to 1.2 times the characteristic impedance of the sending transmission line.

9. The transmit/receive module according to claim 8, wherein the input impedance of the second transmit filter, for frequencies in the pass band of the second transmit filter, is less than or equal to 1.2 times the characteristic impedance of the sending transmission line.

10. The transmit/receive module according to claim 9, wherein the sending transmission line comprises a common portion connected to the power amplifier and a plurality of individual portions, each of the plurality of individual portions being connected to a different one of the transmit filters, the plurality of individual portions connecting to the common portion at a branching point, the transmit/receive module further comprising:
a shunt inductor connected to the common portion.

11. The transmit/receive module according to claim 8, further comprising:
a series inductor in the sending transmission line at a position where a signal input into the first transmit filter is completely reflected, and a signal input into the second transmit filter is transmitted.

12. The transmit/receive module according to claim 8, further comprising:
a low pass filter in the sending transmission line at a position where a signal input into the plurality of transmit filters is transmitted,
wherein a cutoff frequency of the low pass filter is greater than the highest frequency of the pass bands of the plurality of transmit filters.

13. The transmit/receive module according to claim 8, further comprising:
a low-noise amplifier configured to amplify a signal passed by any of the receive filters of the plurality of duplexers, and to output an amplified signal.

14. The transmit/receive module according to claim 8, further comprising:
a mounting substrate on which the plurality of duplexers and the power amplifier are mounted, the sending transmission line being disposed in or on the mounting substrate; and
a receiving transmission line disposed in or on the mounting substrate, signals having passed through the receive filters of the plurality of duplexers being transmitted through the receiving transmission line,
wherein, when the mounting substrate is seen in a plan view, the sending transmission line and the receiving transmission line do not intersect with each other.

15. The transmit/receive module according to claim 8, further comprising:
a mounting substrate on which the plurality of duplexers and the power amplifier are mounted, the sending transmission line being disposed in or on the mounting substrate; and
a receiving transmission line disposed in or on the mounting substrate, signals having passed through the receive filters of the plurality of duplexers being transmitted through the receiving transmission line,
wherein, when the mounting substrate is seen in a plan view, the sending transmission line and the receiving transmission line intersect with each other at an intersecting portion,
wherein, at the intersecting portion, the sending transmission line and the receiving transmission line are disposed at different thicknesses of the mounting substrate, and
wherein the transmit/receive module further comprises a ground plane disposed at the intersecting portion at a thickness between the sending transmission line and the receiving transmission line.

16. The transmit/receive module according to claim 1, further comprising:
a low pass filter in the sending transmission line at a position where a signal input into the plurality of transmit filters is transmitted,
wherein a cutoff frequency of the low pass filter is greater than the highest frequency of the pass bands of the plurality of transmit filters.

17. The transmit/receive module according to claim 1, further comprising:

a low-noise amplifier configured to amplify a signal passed by any of the receive filters of the plurality of duplexers, and to output an amplified signal.

18. The transmit/receive module according to claim 1, further comprising:

a mounting substrate on which the plurality of duplexers and the power amplifier are mounted, the sending transmission line being disposed in or on the mounting substrate; and a receiving transmission line disposed in or on the mounting substrate, signals having passed through the receive filters of the plurality of duplexers being transmitted through the receiving transmission line, wherein, when the mounting substrate is seen in a plan view, the sending transmission line and the receiving transmission line do not intersect with each other.

19. The transmit/receive module according to claim 1, further comprising:

a mounting substrate on which the plurality of duplexers and the power amplifier are mounted, the sending transmission line being disposed in or on the mounting substrate; and a receiving transmission line disposed in or on the mounting substrate, signals having passed through the receive filters of the plurality of duplexers being transmitted through the receiving transmission line, wherein, when the mounting substrate is seen in a plan view, the sending transmission line and the receiving transmission line intersect with each other at an intersecting portion, wherein, at the intersecting portion, the sending transmission line and the receiving transmission line are disposed at different thicknesses of the mounting substrate, and wherein the transmit/receive module further comprises a ground plane disposed at the intersecting portion at a thickness between the sending transmission line and the receiving transmission line.

* * * * *